(12) United States Patent
Sato et al.

(10) Patent No.: US 7,167,154 B2
(45) Date of Patent: Jan. 23, 2007

(54) DISPLAY DEVICE

(75) Inventors: Tomohiko Sato, Chiba (JP); Toshio Miyazawa, Chiba (JP); Hideo Sato, Hitachi (JP); Masahiro Maki, Mobara (JP)

(73) Assignees: Hitachi, Ltd., Tokyo (JP); Hitachi Device Engineering Co. Ltd., Mobara (JP)

( * ) Notice: Subject to any disclaimer, the term of this patent is extended or adjusted under 35 U.S.C. 154(b) by 201 days.

(21) Appl. No.: 10/337,365

(22) Filed: Jan. 7, 2003

(65) Prior Publication Data

US 2003/0174118 A1   Sep. 18, 2003

(30) Foreign Application Priority Data

Jan. 8, 2002   (JP)   .............................. 2002-000979

(51) Int. Cl.
*G09G 3/36*   (2006.01)

(52) U.S. Cl. ........................................ 345/100; 345/204
(58) Field of Classification Search .................. 345/87, 345/90, 92, 95, 99, 100, 204, 205, 88, 89, 345/91, 93, 94, 96, 97, 98
See application file for complete search history.

(56) References Cited

U.S. PATENT DOCUMENTS 5,874,933 A * 2/1999 Hirai et al. .................... 345/89

6,559,824 B1 * 5/2003 Kubota et al. ............... 345/100
6,646,637 B1 * 11/2003 Kageyama et al. ......... 345/204

FOREIGN PATENT DOCUMENTS

| JP | 58-028200 | 2/1983 |
| JP | 62-66291 | 3/1987 |
| JP | 64-044178 | 2/1989 |
| JP | 01-190179 | 7/1989 |
| JP | 05-243577 | 9/1993 |
| JP | 05-281517 | 10/1993 |
| JP | 2000-275611 | 10/2000 |
| JP | 2000-305504 | 11/2000 |
| JP | 2001-1602999 | 8/2001 |

* cited by examiner

*Primary Examiner*—Richard Hjerpe
*Assistant Examiner*—Jean Lesperance
(74) *Attorney, Agent, or Firm*—Antonelli, Terry, Stout and Kraus, LLP.

(57) ABSTRACT

The present invention provides a display device including a scanning driving circuit which exhibits the high degree of freedom in designing of waveforms of scanning signals while ensuring the reduction of power consumption. A shift register served for a scanning driving circuit is driven at a voltage lower than a voltage amplitude of scanning signals. Booster circuits are provided corresponding to respective stages of the shift register. To each booster circuit, a common scanning signal which is in common with other booster circuits is inputted as a signal separate from a shift register output. The scanning signal is selected from the common scanning signal during a period in which the scanning signal is selected in response to the shift register output and the selected scanning signal is outputted to respective gate lines.

30 Claims, 16 Drawing Sheets

DISPLAY DEVICE

BACKGROUND OF THE INVENTION

1. Field of the Invention

The present invention relates to an active matrix type display device.

2. Description of the Related Art

As an active matrix type display device, a liquid crystal display device has been known, for example.

As an example of such an active matrix type display device, there has been known a display device in which a plurality of gate lines which extend in the x direction and are arranged in parallel in the y direction and drain lines which extend in the y direction such that the drain lines cross the gate lines and are arranged in parallel in the x direction are formed on a substrate so as to form a matrix. Then, pixels having active elements which are connected to the gate lines and the drain lines corresponding to this matrix are arranged in a matrix array. Scanning signals are supplied to the gate lines from a scanning driving circuit so as to turn on the active elements of the pixels. On the other hand, video signals are applied to the drain lines from a video signal driving circuit and the video signals are written in the pixels through the active elements in the ON state and a display is performed in response to these signals. With respect to a liquid crystal display device, in general, thin film transistors (TFT) are used as the active elements and the video signals are written in pixel electrodes.

Here, when amorphous silicon (a-Si) is used as a material for forming semiconductor layers of the thin film transistors, the scanning driving circuit and the video signal driving circuit are provided as driver ICs which constitute separate parts. On the other hand, when polycrystalline silicon (polysilicon, p-Si) is used as a material for forming the semiconductor layers of the thin film transistors, there has been known a technique in which the whole or portions of the scanning driving circuit and the video signal driving circuit are not provided as separate parts but are integrally formed on a substrate of a display panel on which the pixels are formed.

FIG. 21 is a view showing one example of a conventional scanning driving circuit. The scanning driving circuit 300 includes a shift register 301, level shifters 302 and buffers 303. These elements are integrally formed on a substrate using polysilicon thin film transistors. Outputs at respective stages of the shift register 301 are respectively subjected to the level conversion by the level shifters 302 and are applied to respective gate lines GLn, GLn+1, . . . through the buffers 303 as scanning signals. Each level shifter 302 is constituted of a CMOS (complementary) circuit. The CMOS circuit is a circuit in which both a P channel MOS transistor (hereinafter simply referred to as PMOS) and an N channel MOS transistor (hereinafter simply referred to as NMOS) are present in a mixed state.

As literatures relevant to this prior art, there exists JP-A-2000-305504, for example. This literature describes a driving circuit integrated liquid crystal display device which integrally forms a vertical driver corresponding to a scanning driving circuit and a horizontal driver corresponding to a video signal driving circuit on a substrate using polysilicon thin film transistors. Here, the vertical driver is constituted of a shift register, a level shift circuit and a buffer. The level shift circuit is formed of a CMOS circuit including a CMOS latch cell and a CMOS inverter.

Further, besides the above-mentioned literature, as a literature which is relevant to the scanning driving circuit, there exists JP-A-5-243577. This literature describes a display device in which a driving circuit at a gate line (gate wiring) side and a driving circuit at a data line (drain wiring) side for active matrix are built in (integrally formed in) the inside of a substrate. The scanning driving circuit is not formed of a CMOS circuit and thin film transistors used in the display device are constituted of polysilicon thin film transistors of either N channel or P channel. Further, a level shifter circuit and a buffer are not provided to the display device. A shift register is constituted of a shift register cell, while the shift register cell is constituted of four transistors and one bootstrap capacitor.

Further, in the above-explained JP-A-5-243577, an example which uses a shift register capable of performing a bootstrap operation as a data line side driving circuit is described. A shift register cell is constituted of a bootstrap capacitor and three transistors. Outputs from the shift register cell are inputted to a gate of a sample holding transistor. Since the output from the shift register cell is applied to the input of the gate with an amplitude which is substantially twice as large as a clock signal due to the bootstrap operation, the sample holding transistor is switched at a high speed.

Besides the above-mentioned literatures, in the JP-A-62-66291, one example of a video signal driving circuit is described. That is, in a thin film scanning circuit in which gates of analogue switches which are constituted of thin film transistors are sequentially selected by a gate selection circuit formed of a complementary (CMOS) thin film transistor, a first electrode of a MOS type capacitor having the same structure as the above-mentioned thin film transistor is connected to a gate of the above-mentioned analogue switch, and a second electrode of the MOS type capacitor is connected to one of internal terminals of the thin film scanning circuit. The gate selection circuit is a logic circuit using a complementary TFT and is formed of a shift register or the like, for example. Here, the gate of the gate selection circuit does not imply a gate of the gate line of the active matrix panel but implies a gate which is served for selecting a gate of a analogue switch in the inside of the video signal driving circuit. Accordingly, the gate selection circuit is not used as a scanning signal driving circuit but is used as a video signal driving circuit. Due to such a constitution, the gate of the analogue switch has a voltage thereof elevated to a value which is approximately twice as large as a power supply voltage due to a bootstrap effect of the MOS type capacitor so that a load driving ability of the analogue switch is increased. Accordingly, video signals are applied to video signal lines (corresponding to drain lines) through the analogue switches in the ON state.

An example of another video signal driving circuit is described in JP-A-5-281517. In this literature, the video signal driving circuit is constituted of a switch served for transferring video signals and a circuit which drives the switch. The circuit which drives the switch includes a shift register and booster means which boosts an output of the shift register. Here, the booster means is formed of a transistor, a capacitive element and a diode. Due to such a constitution, while a power supply voltage applied to respective transistors in the inside of the shift register and a booster circuit is being held at a low voltage of 7V, a high voltage of 12.3V can be generated so that signals (video signals) having an amplitude of 11V can be handled. Here, the booster means uses two or more shift register outputs with respect to one switch and, at the same time, the same shift register output is used in common partially by a plurality of switches. Further, as thin film transistors, NMOS transistors or PMOS transistors are used. Still further, in this literature, there is a description that active elements, switches for transfer, the shift register and the booster means are preferably integrally formed on a same base body (on a same substrate) as a semiconductor integrated circuit.

An example of still another video signal driving circuit is described in JP-A-2000-275611. In this literature, a video signal driving circuit is constituted of a driver IC which is arranged on a tape carrier as an external circuit of an LCD panel and a time-division switch which is formed on the LCD panel. Pixel signals (video signals) are outputted as time-sequential signals corresponding to the number of time-division (3 in this embodiment) from the driver IC. Then, these time-sequential pixel signals are sampled by time-division using time-division switches and are supplied to signal lines corresponding to the pixel signals (drain lines corresponding to R, G, B in this literature). Due to such a constitution, it is possible to reduce the number of output pins of the driver ICs compared to the number of drain lines. Analogue switches are used as the time-division switches. A set of time-division switches are formed of transmission switches having the CMOS constitution which are constituted of three PchMOS transistors and three NchMOS transistors. A set of time-division switches are formed on the same substrate as an LCD panel using polysilicon TFTs. These are controlled by six control lines in total consisting of three selecting signals and three inverting signals of selecting signals.

However, the devices described in these literatures have following drawbacks.

First of all, with respect to the scanning driving circuit, in FIG. 21 and JP-A-2000-305504, the CMOS circuit is used in the level shift circuit. Accordingly, it is necessary to form both PMOS transistor and NMOS transistor in the manufacturing steps and hence, the number of processes is increased. With respect to the gate side driving circuit described in JP-A-5-243577, the CMOS circuit, the level shift circuit and the buffer are eliminated by using the bootstrap capacitor in the shift register. However, to the gate lines (gate wiring), as the scanning signals, signals which elevates the voltage once and, thereafter, elevates the voltage again to another stage is applied.

Further, with respect to the video signal driving circuit, JP-A-2000-275611 describes the example which uses the time-division switches. However, since the time-division switches adopt the CMOS constitution and hence, the number of manufacturing processes is increased. This literature describes that the transmission switches having the PMOS or NMOS constitution may be used. However, no specific constitutional examples are described in the publication and hence, it is considered that the transmission switches are controlled by three control lines instead of six control lines in this case. However, in case that the PMOS or NMOS constitution, that is, the single channel constitution is adopted, when the voltage of control lines inputted to the gates of analogue switches used in the time-division switches and the voltage of video signals are close, there arises a problem that the voltage of video signals is changed in front of and behind the switches due to the resistance of the transistors.

Further, with respect to the video signal driving circuit, JP-A-5-243577, 62-66291 and 5-281517 describe examples in which the video signal driving circuit utilizes a bootstrap effect when analogue switches are turned on. However, these literatures fail to describe the time-division switches and assumes the use of the shift register as a presumption so that the combination of the shift register and the time-division switches is also not taken into consideration.

Accordingly, it is the first object of the present invention to provide a display device having a scanning driving circuit which ensures high degree of freedom in designing waveforms of scanning signals while reducing power consumption.

It is the second object of the present invention to provide a display device having a video signal driving circuit with small power consumption which can apply video signals having least degradation to drain lines while reducing the number of output pins of driver ICs.

It is the third object of the present invention to provide a display device requiring the least number of manufacturing processes.

SUMMARY OF THE INVENTION

To achieve the above-mentioned first object, according to the present invention, a shift register which is used in a scanning driving circuit is driven with a voltage lower than a voltage amplitude of a scanning signal, booster circuits are provided corresponding to respective stages of the shift register, a common scanning signal which is shared by other booster circuits in common is inputted to the booster circuit as a signal separate from a shift register output, and a scanning signal is selected out of the common scanning signal during a period in which the common scanning signal is selected in response to the shift register output and is outputted to the respective gate lines.

To achieve the second object of the present invention, video signals are outputted by time-division from the drain drivers served for a video signal driving circuit, the video signals are distributed to corresponding drain lines with the use of the distributing circuit. With respect to each one of switches used in this distributing circuit, a voltage of a gate of the switch is elevated to a value equal to or more than a voltage of distribution control signals in two stages using two distribution control signals in common with other distributing circuit so as to make the voltage of the gate of the switch sufficiently larger than a voltage amplitude of the video signals and, thereafter, the video signals are outputted to the drain lines.

To achieve the third object of the present invention, a channel of thin film transistors provided at a portion of a driving circuit which is integrally formed on a substrate adopts a single channel constitution which is equal to that of thin film transistors of pixels.

To enumerate typical constitutions of the display device to achieve the first object of the present invention, they are as follows. Here, by adopting the single channel constitution, it is possible to achieve the third object of the present invention.

(1) In a display device comprising:
 a substrate;
 a plurality of gate lines formed on the substrate;
 a plurality of drain lines formed on the substrate and crossing the plurality of gate lines;
 a plurality of pixels having thin film transistors which are connected to the gate lines and the drain lines;
 a scanning driving circuit formed on the substrate and capable of applying a scanning signals to the gate lines; and
 a control circuit for supplying necessary signals to the scanning driving circuit, wherein
 the scanning driving circuit includes a shift register which generates outputs of a plural stages respectively corresponding to the plurality of gate lines and a plurality of driving parts which output the scanning signal to the corresponding gate line upon inputting of one of the outputs of plurality of stages of the shift register to the driving parts, and a common scanning signal which is formed of a row of the plurality of scanning signals having a voltage amplitude larger than a voltage amplitude of an output of the shift register is inputted to two or more driving parts in common from the control circuit, and each driving part includes a booster circuit to which the output of the shift register which is inputted to the driving part and the common scanning signal are inputted, and the booster circuit selects the scanning signal which is inputted during a period in which the output of the shift register is inputted out of the row of the plurality of scanning signals of the common scanning signal, and outputs the scanning signal having the voltage amplitude larger than the voltage amplitude of the output of the shift register to the corresponding gate line.

(2) In the constitution (1), wherein the driving parts respectively include one or more thin film transistors and are integrally formed on the substrate, and the pixels and the thin film transistors used in the driving parts have a single channel.

(3) In the constitution (2), the booster circuit includes first and second thin film transistors each of which includes a gate electrode, a first electrode and a second electrode, and a capacitive element which includes a first electrode and a second electrode, the gate electrode of the first thin film transistor is connected to a DC voltage signal, the first electrode of the first thin film transistor is connected to an output of the shift register, the second electrode of the first thin film transistor is connected to the gate electrode of the second thin film transistor and the first electrode of the capacitive element, the first electrode of the second thin film transistor is connected to the common scanning signal, and the second electrode of the second thin film transistor is connected to the second electrode of the capacitive element and the gate lines.

(4) In the constitution (2) or (3), the shift register includes at least one thin film transistor and is integrally formed on the substrate, the thin film transistors used in the pixels, the driving parts and the shift register have a signal channel.

(5) In any one of the constitutions (1) to (4), the driving part has a reset circuit which applies an OFF potential of the thin film transistor of the pixel to the gate line during a period in which the output from the shift register is not inputted to the booster circuit.

(6) In the constitution (5), the reset circuit includes an inverting circuit which inverts the output from the shift register.

(7) In any one of the constitutions (1) to (6), the driving part includes a changeover switch circuit which changes over the stop and the permission of an operation of the booster circuit.

(8) In the constitution (7), the changeover switch circuit is a circuit to which the first and second changeover switch signals are inputted and which stops the operation of the booster circuit during a period in which a ground potential is inputted to the first changeover switch signal and a DC voltage signal is inputted to the second changeover switch signal and permits the operation of the booster circuit when a DC voltage signal is inputted to the first changeover switch signal and a ground potential is inputted to the second changeover switch signal.

(9) In the constitution (7) or (8), the control circuit is configured to perform at least one cycle of scanning by controlling the shift clock in a state that the operation of the booster circuit is stopped by controlling the changeover switch circuit before starting a display and, thereafter, to permit the operation of the booster circuit to start the display.

(10) In any one of the constitutions (1) to (9), the common scanning signal includes a first common scanning signal which is transmitted through a first common scanning signal line and a second common scanning signal which is transmitted through a second common scanning signal line and has a phase different from a phase of the first common scanning signal, and the booster circuits are divided into a first group in which the first common scanning signal is inputted to the booster circuits in common and a second group in which the second common scanning signal is inputted to the booster circuits in common and booster circuits do not belong to the first group.

(11) In the constitution (10), the booster circuits which correspond to the odd-numbered gate lines belong to the first group, and the booster circuits which correspond to the even-numbered gate lines belong to the second group.

(12) In any-one of the constitutions (1) to (11), the display device includes a counter substrate which is arranged to face the substrate in an opposed manner, and a liquid crystal layer which is sandwiched between the substrate and the counter substrate.

To enumerate typical constitutions of the display device to achieve the second object of the present invention, they are as follows. Here, by adopting the single channel constitution, it is possible to obtain the third object of the present invention.

(13) In a display device comprising:

a substrate;

a plurality of gate lines formed on the substrate;

a plurality of drain lines formed on the substrate and crossing the plurality of gate lines;

a plurality of pixels having thin film transistors which are connected to the gate lines and the drain lines;

a video signal driving circuit for applying video signals to the drain lines; and a control circuit for supplying necessary signals to the video signal driving circuit, wherein the video signal driving circuit includes drain drivers which output video signals applied to two or more drain lines by time-division to the common video signal line, and distributing circuits which are integrally formed on the substrate for distributing the video signals outputted by time-division to the common video signal line to the corresponding drain lines, the distributing circuits perform a distribution control such that distribution control signals which are twice as large as the drain lines corresponding to one common video signal line in number are inputted to the distributing circuit, the distributing circuit includes a plurality of thin film transistors, wherein the thin film transistors are n-type thin film transistors having a channel equal to a channel of the thin film transistors of the pixels, the thin film transistors have respective first electrodes thereof connected to the common video signal line, have respective second electrodes thereof connected to the corresponding drain lines, and have voltages of respective gate electrodes controlled based on respective corresponding two distribution control signals out of the distribution control signals, the voltage of the gate electrodes of the thin film transistors of the distributing circuit is elevated to a first voltage in response to one of two corresponding distribution control signals and is elevated to a second voltage which is higher than the first voltage in response to the other distribution control signal, and the second voltage is controlled to a voltage which is larger than the sum of a maximum value of the voltage of the video signal and a threshold value voltage of the thin film transistor and is set larger than the voltage of the distribution control signal, and the distribution control signals are used in common for distribution of two or more common video signal lines.

(14) In the constitution (13), a period in which the voltage of the gate electrodes of the thin film transistors of the distributing circuit assumes the second voltage is longer than 50% of a period in which the voltage of the gate electrodes assumes a value equal to or more than the first voltage.

(15) In the constitution (14), a period in which the voltage of the gate electrodes of the thin film transistors of the distributing circuit assumes the second voltage is equal to or more than 75% of a period in which the voltage of the gate electrodes assumes a value equal to or more than the first voltage.

(16) In any one of the constitutions (13) to (15), the distributing circuit constitutes a circuit for distributing the video signals from one common video signal line to the drain lines which respectively correspond to the pixels of red, green and blue.

(17) In any one of the constitutions (13) to (16), the display device includes a counter substrate which is arranged to face the substrate in an opposed manner, and a liquid crystal layer which is sandwiched between the substrate and the counter substrate.

(18) In a display device comprising:

a substrate;

a plurality of gate lines formed on the substrate;

a plurality of drain lines formed on the substrate and crossing the plurality of gate lines;

a plurality of pixels having thin film transistors which are connected to the gate lines and the drain lines;

a video signal driving circuit capable of applying video signals to the drain lines; and a control circuit for supplying necessary signals to the video signal driving circuit, the video signal driving circuit includes drain drivers which output the video signals applied to two or more drain lines to a common video signal line by time-division and distributing circuits which are integrally formed on the substrate for distributing the video signals which are outputted to the common video signal line by time-division to the corresponding drain lines, the distributing circuits perform a distribution control in which distribution control signals which are twice as large as the drain lines which correspond to one common video signal line in number are inputted to the distributing circuit, the distributing circuit includes a plurality of thin film transistors, wherein the thin film transistors are p-type thin film transistors having a channel equal to a channel of the thin film transistors of the pixels, the thin film transistors have respective first electrodes thereof connected to the common video signal line, have respective second electrodes thereof connected to the corresponding drain lines, and have voltages of respective gate electrodes controlled based on respective corresponding two distribution control signals out of the distribution control signals, the voltage of the gate electrodes of the thin film transistors of the distributing circuit is lowered to a first voltage in response to one of two corresponding distribution control signals and is lowered to a second voltage which is lower than the first voltage in response to the other distribution control signal, and the second voltage is controlled to a voltage which is smaller than the sum of a minimum value of the voltage of the video signal and a threshold value voltage of the thin film transistor and is smaller than the voltage of the distribution control signal, and the distribution control signals are used in common for distribution of two or more common video signal lines.

(19) In the constitution (18), a period in which the voltage of the gate electrodes of the thin film transistors of the distributing circuit assumes the second voltage is longer than 50% of a period in which the voltage of the gate electrodes assumes a value equal to or less than the first voltage.

(20) In the constitution (18), a period in which the voltage of the gate electrodes of the thin film transistors of the distributing circuit assumes the second voltage is equal to or more than 75% of a period in which the voltage of the gate electrodes assumes a value equal to or less than the first voltage.

(21) In any one of the constitutions (18) to (20), the distributing circuit constitutes a circuit for distributing the video signals from one common video signal line to the drain lines which respectively correspond to the pixels of red, green and blue.

(22) In any one of the constitutions (18) to (21), the display device includes a counter substrate which is arranged to face the substrate in an opposed manner, and a liquid crystal layer which is sandwiched between the substrate and the counter substrate.

The present invention is not limited to the above-mentioned constitutions and embodiments which will be explained hereinafter and various modifications can be made without departing from the technical concept of the present invention. Further, tasks, constitutions and advantageous effects of the present invention other than the above-mentioned objects will become apparent in view of the whole specification including embodiments.

DESCRIPTION OF THE PREFERRED EMBODIMENTS

The present invention is explained hereinafter in conjunction with preferred embodiments and drawings. In the embodiments described hereinafter, the explanation is made using a liquid crystal display device as an example of the display device of the present invention.

[Explanation of the Entire Constitution]

Figure 1:
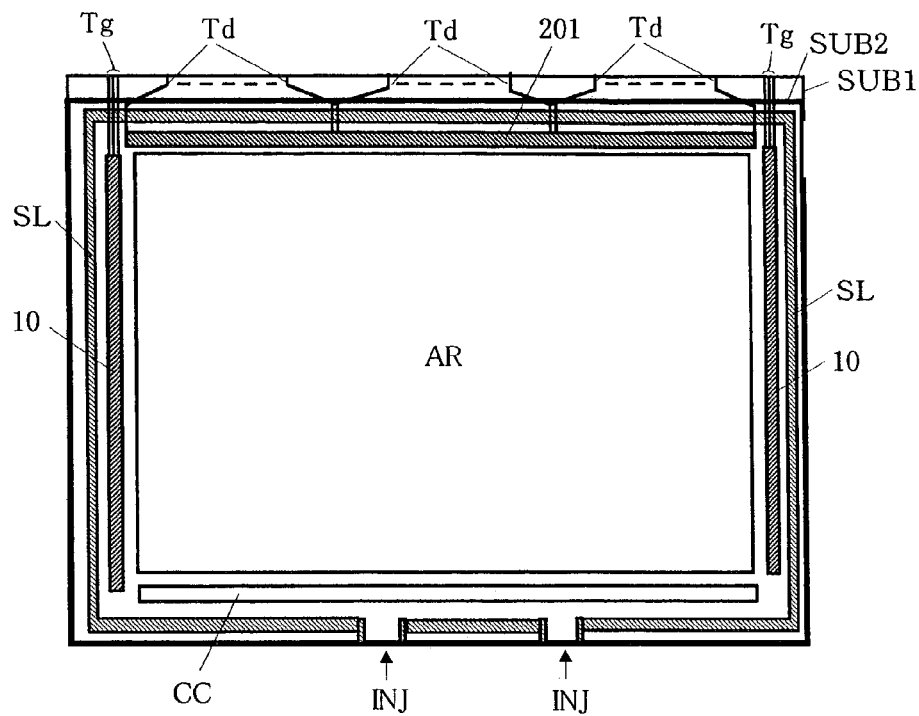
FIG. 1 is a plan view showing one example of a display panel used in a display device according to the present invention.

FIG. 1 is a plan view showing one example of a display panel used in a display device according to the present invention.

SUB1 indicates a substrate and SUB2 indicates a counter substrate, wherein these substrates are preferably formed of glass or plastic. AR indicates a display region in which pixels not shown in the drawings are arranged in a matrix array and places other than this display region AR are referred to as picture frame regions.

On the substrate SUB1, scanning driving circuits 10 which apply scanning signals to gate lines GL not shown in the drawing and a video signal circuit 201 which applies video signals to drain lines DL not shown in the drawing are mounted. On the substrate SUB1, gate-side connection terminals Tg which are connected to external portions are formed so as to supply control signals and electricity to the scanning driving circuits 10. Further, on the substrate SUB1, drain-side connection terminals Td which are connected to external portions are formed so as to supply video signals, control signals and electricity to the video signal circuit 201. The connection terminal Td is formed by arranging a plurality of lead lines in a bundle at one place. Further, on the substrate SUB1, an inspection circuit CC which inspects the disconnection of drain lines DL not shown in the drawing is formed.

The substrate SUB1 and the counter substrate SUB2 are laminated to each other using a seal SL formed of epoxy resin or the like, for example, such that the substrate SUB1 and the counter substrate SUB2 sandwich a liquid crystal layer LC not shown in the drawing therebetween and surrounds the display region AR together with the seal SL. The liquid crystal layer LC is filled in a space defined between the substrate SUB1 and the counter substrate SUB2 through filling ports INJ and is sealed thereafter by epoxy resin or the like. The counter substrate SUB2 is made smaller than the substrate SUB1 so that the connection terminals Td, Tg are connected to the external portions at projecting portions of the substrate SUB1.

Figure 2:
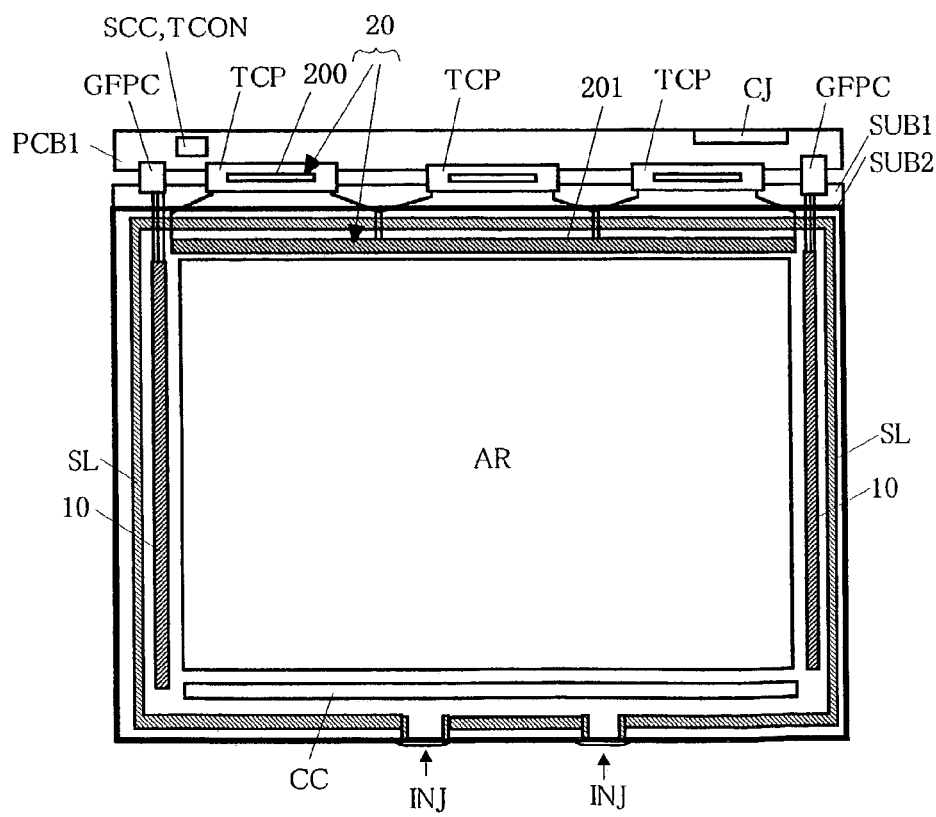
FIG. 2 is a view showing one example of a display device according to the present invention and also is a plan view showing one example in which a printed circuit board is connected to a display panel.

FIG. 2 is a view showing one example of a display device according to the present invention, and is a plan view showing an example in which a printed circuit board is connected to a display panel.

The printed circuit board PCB1 includes a power source SCC, a timing controller TCON and a connector part CJ which is connected to an external equipment such as a personal computer and through which electricity and signals are supplied. The printed circuit board PCB1 is connected to the connection terminal Tg at the gate side of the display panel through a flexible printed circuit board GFPC at the gate side of the printed circuit board PCB1. On the other hand, the printed circuit board PCB1 is connected to the connection terminal Tg at the drain side of the display panel through a tape carrier package TCP. A drain driver 200 which is constituted of a driving IC chip is mounted on the tape carrier package TCP by a tape automated bonding method (TAB). A video signal driving circuit 20 includes the drain driver 200 and a video signal circuit 201.

Figure 3:
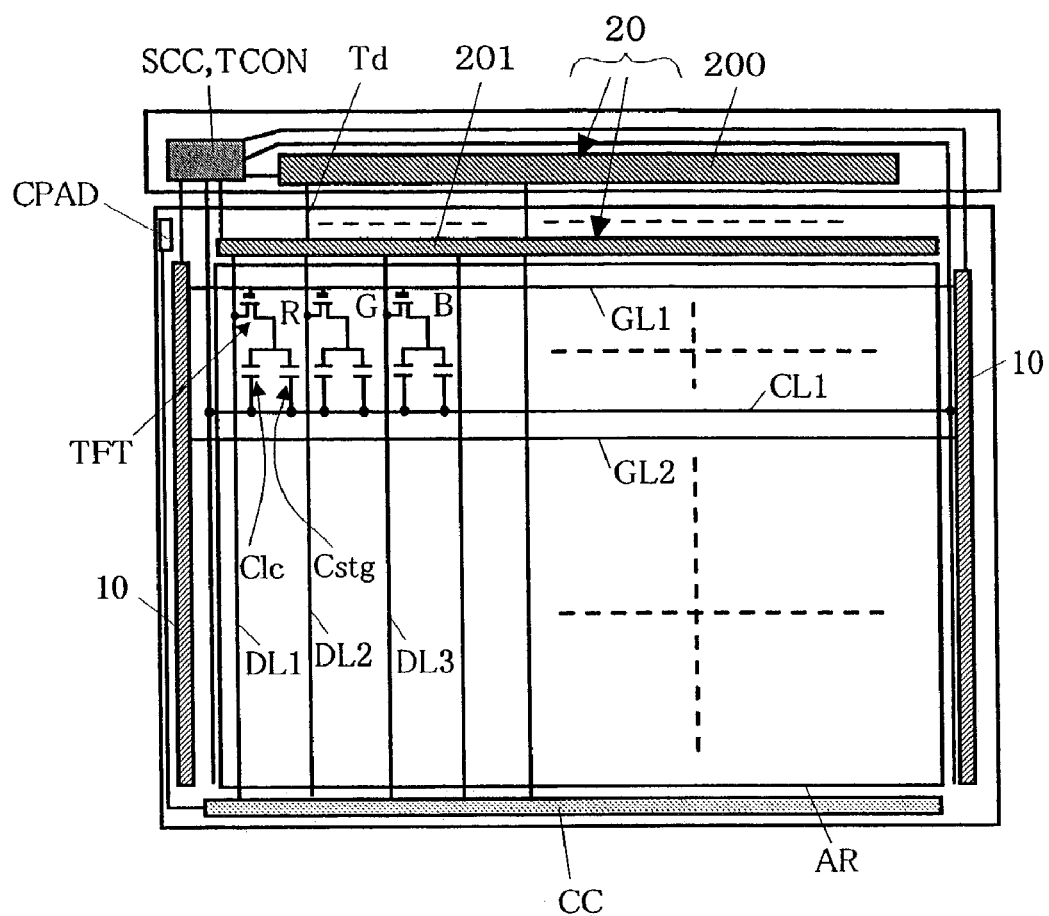
FIG. 3 is a view showing one example of an equivalent circuit of a display device according to the present invention.

FIG. 3 is a view showing an example of an equivalent circuit of a display device according to the present invention.

In the display region AR, a plurality of gate lines GL (GL1, GL2, . . . ) which extend in the right and left direction and are arranged in parallel in the upward and downward direction in the drawing and a plurality of drain lines DL (DL1, DL2, DL3, . . . ) which extend in the upward and downward direction such that the drain lines DL cross the gate lines GL and are arranged in parallel in the left and right direction are formed thus constituting a matrix on a substrate SUB1. Pixels are arranged corresponding to this matrix in a matrix array. The gate lines GL are connected to the scanning driving circuits 10, while the drain lines DL are connected to the video signal circuit 201 of the video signal driving circuit 20. Each pixel includes a thin film transistor TFT as an active element and the thin film transistor TFT has a gate electrode thereof connected to the gate line GL, a drain electrode thereof connected to the drain line DL and a source electrode thereof connected to a pixel electrode not shown in the drawing. In this embodiment, the thin film transistor TFT is formed of a n-type polysilicon thin film transistor.

Further, common electrode lines CL (CL1, CL2, . . . ) are formed on the substrate SUB1. Each pixel includes a counter electrode not shown in the drawing which is connected to the common electrode line CL. The pixel electrode and the counter electrode form a liquid crystal capacity C1c via a liquid crystal layer LC not shown in the drawing. Further, a storage capacity (Cstg) is formed between the common electrode line CL and the pixel electrode and this storage capacity Cstg plays a role of holding the potential of video signals written in the pixel electrode for a relatively long period.

R, G, B respectively correspond to red, green and blue pixels, wherein pixels having the same color are arranged in the longitudinal direction in the drawing. And the pixels are repeatedly arranged in a stripe shape in the lateral direction in the drawing in the order of R, G, B, R, G, B, . . . . To realize these colors, red, green and blue color filters not shown in the drawing which correspond to the red, yellow and green pixels are formed on the counter substrate SUB2 in a stripe shape.

The scanning signals are applied to the gate lines GL in the order from the first gate line GL1 to the lowermost gate line by the scanning driving circuit 10 and hence, the thin film transistors TFT of the pixels of the scanned line are turned on. On the other hand, video signals supplied from the video signal driving circuit 20 are applied to the drain lines DL and the video signals are written in the pixel electrodes through the thin film transistors TFT in the ON state. A common potential is applied to the common electrode lines CL so that a lateral electric field in the in-plane direction is generated in the pixel due to the potential difference between the pixel electrode and the counter electrode whereby the liquid crystal of the liquid crystal layer LC is driven. By controlling an amount of light which is incident on a display panel, passes the liquid crystal layer LC and is irradiated from the display panel, the display is performed. A display method which utilizes such a lateral electric field is referred to as a lateral electric field switching method (IPS: In-Plane Switching method).

Although the invention is explained by taking the IPS method as an example in this embodiment, a liquid crystal display device adopting a vertical electric field method which forms counter electrodes at the counter substrate SUB2 side instead of forming the common electrode lines CL and the counter electrodes at the substrate SUB1 side may be used in this embodiment.

Further, in this embodiment, to reduce the delay of scanning signals or the dullness of waveforms which are generated when the gate lines GL are arranged remoter from the scanning driving circuit 10, the liquid crystal display device adopts the constitution in which the scanning signals are applied to the gate lines GL from both scanning driving circuits 10 arranged at left and right sides in the drawing. However, the layout of the scanning driving circuit 10 is not limited to such an arrangement and the scanning driving circuit 10 may be arranged on only at one side of the drawing (FIG. 3).

Signals (electricity and control signals) necessary for the scanning driving circuit 10, the drain driver 200 of the video signal driving circuit 20, the video signal circuit 201 and the common electrode lines CL are supplied from a power supply circuit SCC and a timing controller TCON.

The drain lines DL are connected to an inspection circuit CC and it is possible to inspect the disconnection of the drain lines DL using an inspection terminal CPAD mounted on the substrate SUB1.

First Embodiment

Figure 4:
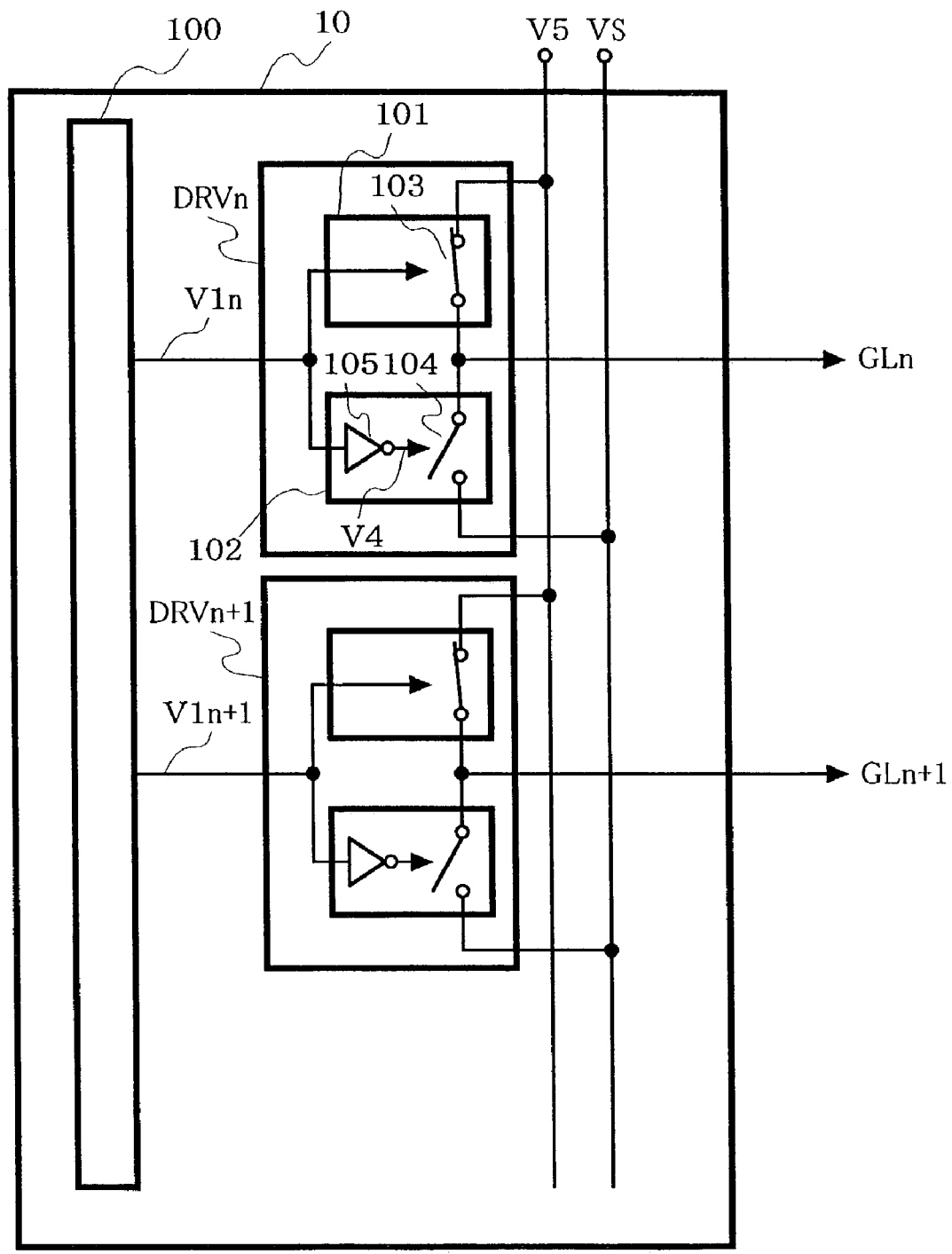
FIG. 4 is a view for explaining one example of the constitution of a scanning driving circuit of a display device in the first embodiment of the present invention.

FIG. 4 is a view for explaining one example of the constitution of a scanning driving circuit of a display device according to the first embodiment of the present invention.

The scanning driving circuit 10 used in this embodiment includes a shift register 100 and driving parts DRV. The shift register 100 includes outputs V1 (V1n, V1n+1, . . . ) in a plurality of stages. Upon receiving a shift register start pulse VIN not shown in the drawing, the shift register 100 sequentially outputs the n-th output V1n, the (n+1)th output V1n+1, . . . in synchronism with clocks CK1, CK2 not shown in the drawing. Then, these outputs V1n, V1n+1, . . . are inputted to the n-th driving part DRVn, the (n+1)th driving part DRVn+1, . . . corresponding to these outputs V1n, V1n+1, . . . , and the scanning is performed by applying scanning signals to n-th gate line GLn, the (n+1)th gate line GLn+1, corresponding to the driving parts DRVn, DRVn+1, . . . .

Here, the driving part DRVn includes a booster circuit 101. To the booster circuit 101, the shift register output V1n and a common scanning signal V5 which is formed of a row of a plurality of scanning signals and has a voltage amplitude larger than that of the shift register output V1n are inputted. Further, this common control signal V5 is configured to be inputted to the other driving parts DRVn+1 and the like in common. The booster circuit 101 includes a switch 103. This switch 103 is controlled in response to the shift register output V1n and selects the scanning signal which is inputted during a period in which the shift register output V1n is inputted among the row of a plurality of scanning signals constituting the common scanning signal V5 and outputs the scanning signal to the corresponding gate line GLn. The scanning signal is formed of a signal which has a voltage amplitude larger than that of the shift register output V1n. Accordingly, the driving voltage of the shift register 100 is lower than the voltage amplitude of the scanning signal and hence, the power consumption can be reduced.

Further, the driving part DRVn has a reset circuit 102. The reset circuit 102 has an inverting circuit 105 into which the shift register output V1n is inputted and from which an inverting signal V4 is outputted. Further, an OFF potential VS of a thin film transistor TFT of a pixel connected to the gate line GL is inputted to the reset circuit 102. The reset circuit 102 includes a switch 104 which is controlled in response to the inverting signal V4 and outputs the OFF potential VS to the corresponding gate line GLn through this switch 104. In this manner, the switch 103 of the booster circuit 101 and the switch 104 of the reset circuit 102 are subjected to an exclusive control so that the reset circuit 102 applies the OFF potential VS of the thin film transistor TFT of the pixel to the corresponding gate line GLn during a period in which the shift register output V1n is not inputted to the booster circuit 101. In this manner, the scanning driving circuit prevents the gate line GLn from taking a floating state during the period that the scanning is not performed. Accordingly, the change of voltage of the gate line GLn which is caused by the fluctuation of voltage of the drain line DL when the gate line GLn is in the floating state can be reduced so that the influence given to image quality can be reduced. This OFF potential VS is configured to be inputted to other driving parts DRVn+1 and the like in common.

Although the inverting signal V4 is generated by the inverting circuit 105 incorporated in the reset circuit 102 in this embodiment, the generation of the inverting signal V4 is not limited to such a constitution. That is, the inverting signal V4 which is generated separately from the inverting circuit 105 may be inputted to the driving part DRVn.

Although the driving part has been explained taking the driving part DRVn as an example heretofore, other driving part DRVn+1 and the like have the same constitution as the driving part DRVn.

Here, electricity and control signals which constitute signals necessary for these operations are supplied from a power source SCC and a timing controller TCON and these power source circuit SCC and the timing controller TCON play a role of a control circuit. In this embodiment, a shift clock start pulse VIN, clocks CK1, CK2, the common scanning signal V5 and the OFF potential VS are supplied from the control circuit.

Subsequently, an example of the specific circuit constitution is explained.

Figure 5:
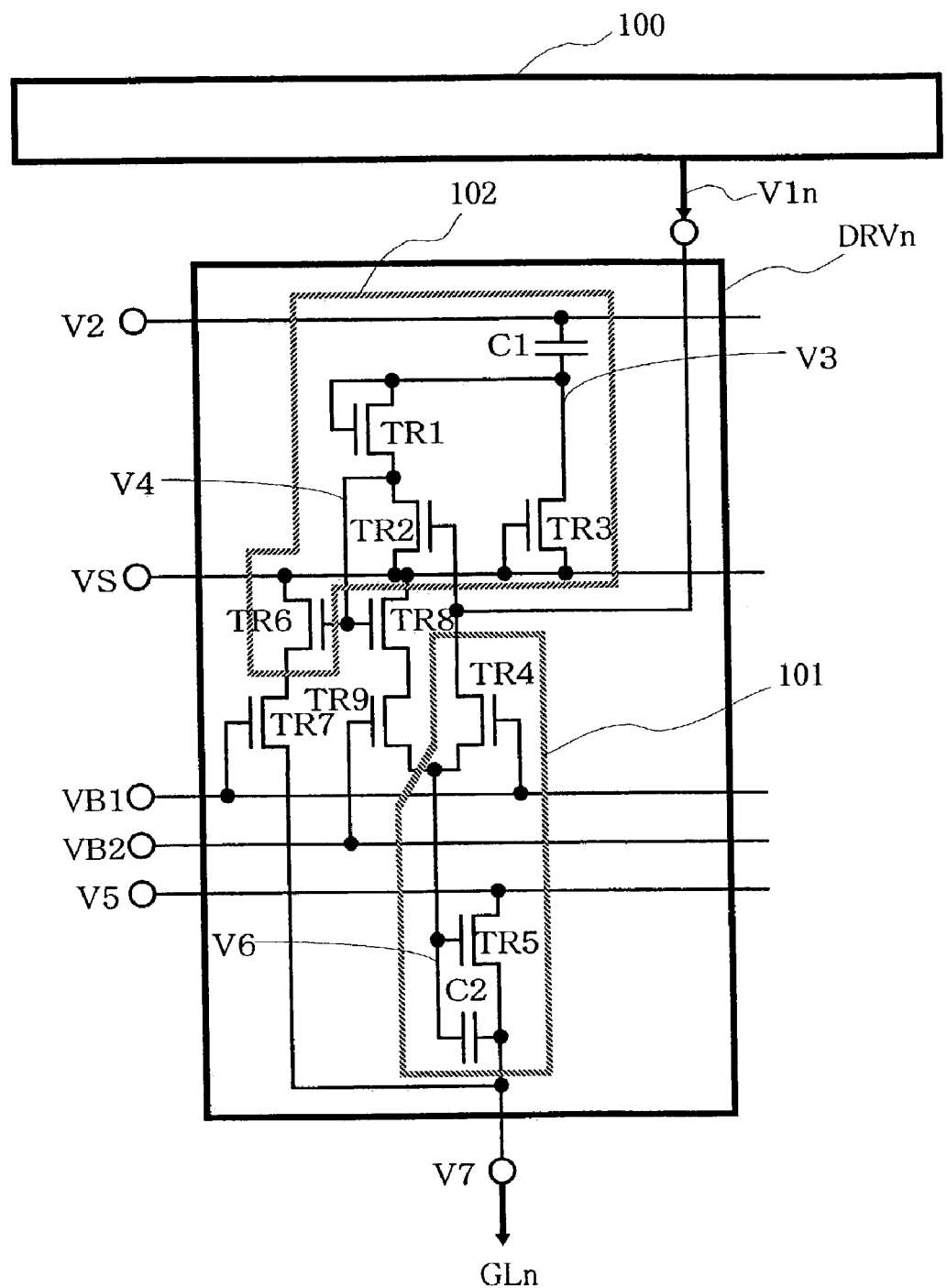
FIG. 5 is a view for explaining one example of the circuit constitution of a driving part in the first embodiment of the present invention.
Figure 6:
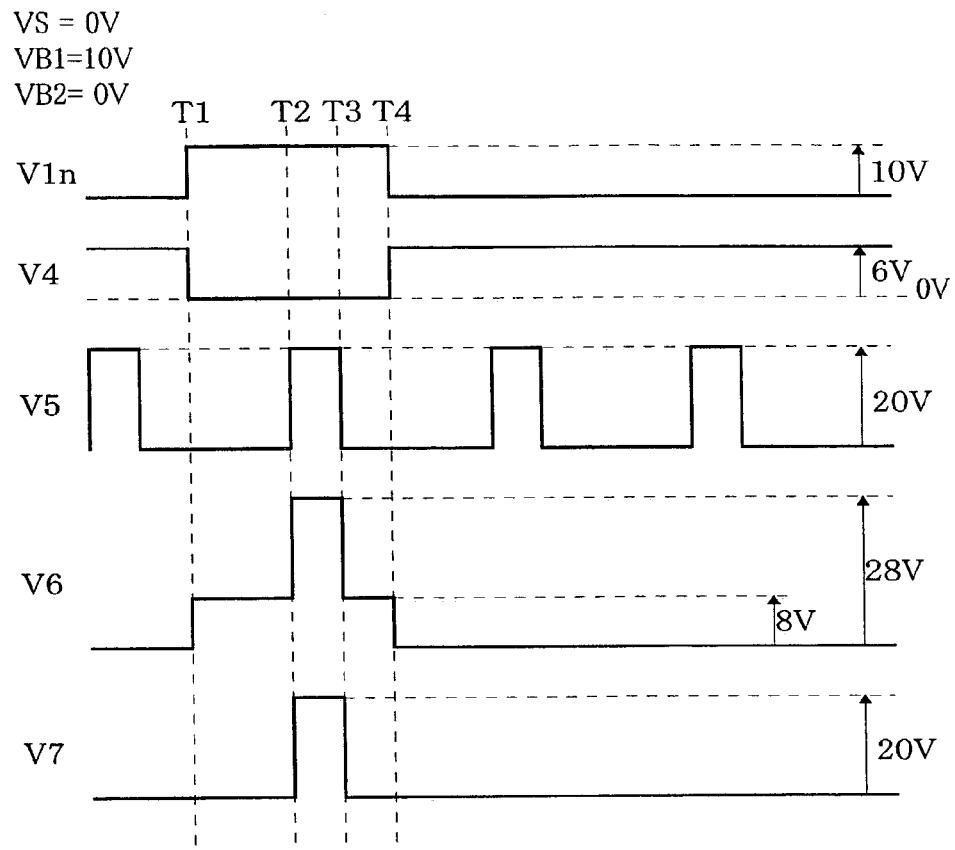
FIG. 6 is a waveform diagram for explaining one example of the manner of operation of a circuit of the driving part shown in FIG. 5.
Figure 7:
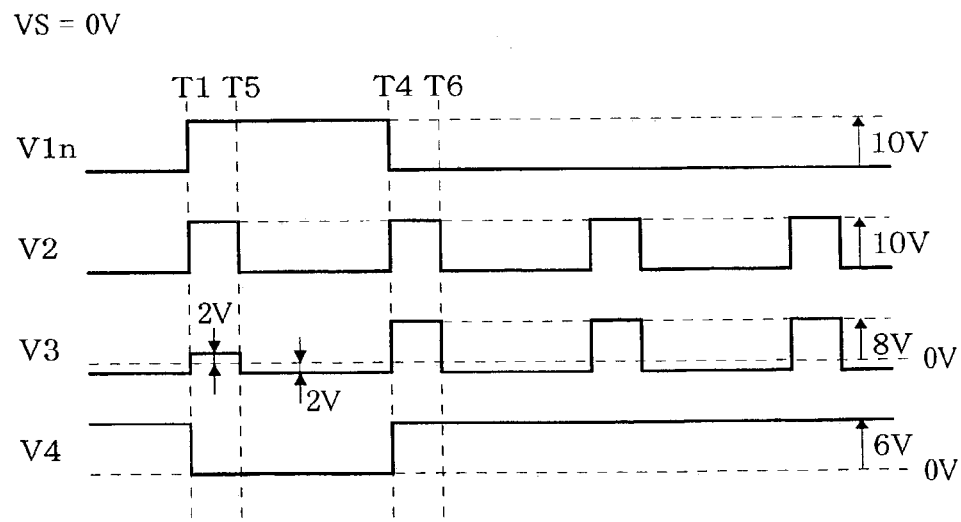
FIG. 7 is a waveform diagram for explaining one example of the manner of operation of a reset circuit in the driving part shown in FIG. 5.

FIG. 5 is a view for explaining one example of the circuit constitution of the driving part according to the first embodiment of the present invention. FIG. 6 is a waveform diagram for explaining one example of the manner of operation of a circuit of the driving part shown in FIG. 5. FIG. 7 is a waveform diagram for explaining one example of the manner of operation of the reset circuit in the inside of the driving part shown in FIG. 5.

Here, the n-th driving part DRVn is explained as a typical example.

In the driving part DRVn, the booster circuit 101 includes transistors TR4, TR5 and a capacitive element C2. Further, the reset circuit 102 includes transistors TR1, TR2, TR3, TR6 and a capacitive element C1. Further, in addition to these components, the driving part DRVn includes transistors TR7, TR8, TR9. The transistors TR1 to TR9 which are used in the driving part DRVn are formed of the n-type polysilicon thin film transistors and are integrally formed on the substrate SUB1. These transistors and the thin film transistor TFT of the pixel adopt the same conductive type and hence, the transistor of the pixel and the transistor of the driving part DRV constitute a single channel. Accordingly, these transistors can be manufactured using the least number of manufacturing processes. Here, when the shift register 100 is constituted of a CMOS circuit, by forming the shift register 100 as a separate component on the substrate SUB1 without integrally forming the shift register 100 with the substrate SUB1, the component on the substrate SUB1 form the single channel constitution and hence, the number of manufacturing processes can be reduced. Each one of transistors TR1 to TR9 includes a gate electrode, a first electrode and a second electrode. In this embodiment, the explanation is made by assuming a threshold value as 2V. Further, the parasitic capacity of the transistor is ignored. Further, although voltages and the like are explained by showing specific numerical values in this specification, they merely constitute one example and can be suitably changed without departing from a scope of a technical concept.

The voltage V3 indicates a voltage of the gate electrode of the transistor TR1 and the voltage V6 indicates a voltage of the gate electrode of the transistor TR5. The driving part output V7 is an output of the driving part DRVn and the driving part output V7 is applied to the corresponding gate line GLn as a scanning signal.

The n-th shift register output V1n is changed from 0V (Low) to 10V (High) at a timing T1 and returns to 0 volt at a timing T4 as shown in FIG. 6. A period from the time T1 to the timing T4 defines a period of outputting of the shift register 100.

The OFF output VS inputted to the reset circuit 102 is 0V. The clock V2 inputted to the reset circuit 102 assumes two values of 0V (Low) and 10V (High). A changeover switch signal VB1 inputted to the driving part DRVn is 10V and a changeover switch signal VB2 inputted to the driving part DRVn is 0V. The detail of these signals is explained later. The common scanning signal V5 is a row of scanning signals having two values of 0V (Low) and 20V (High). The voltage amplitude of the common scanning signal V5 is 20V which is greater than the operational voltage of the shift register. The OFF output VS, the clock V2, the changeover switch signals VB1, VB2 and the common scanning signal V5 are supplied from the control circuit and are inputted to other driving parts DRVn+1 and the like in common.

First of all, the manner of operation of the booster circuit 101 is explained. The booster circuit 101 performs the operation only during the period in which the shift register output V1n is inputted to the booster circuit 101.

Since the changeover switch signal VB1 is 10V, the transistor TR7 assumes the ON state. Further, since the changeover switch signal VB2 is 0V, the transistor TR9 assumes the OFF state.

When the shift register output V1n is changed from 0V to 10 V at the timing T1, the inverting signal V4 is changed from 6V (High) to 0V (Low) in the reset circuit 102 as explained later. Here, the transistor TR6 assumes the OFF state. Accordingly, the driving part output V7 constitutes an output of the booster circuit 101 during this period. The changeover switch signal VB1 is connected to the gate electrode of the transistor TR4 and hence, the gate electrode assumes 10V. The shift register output V1n is connected to the first electrode of the transistor TR4. Here, the second electrode of the transistor TR4 is connected to the gate electrode of the transistor TR5 and the first electrode of the capacitive element C2. Since the voltage V6 is reduced by a threshold value 2V of the transistor TR4 and hence, the voltage V6 is saturated to 8V (V6=10V−2V=8V). Accordingly, the transistor TR5 assumes the ON state. The transistor TR5 has the first electrode thereof connected to the common scanning signal V5 and the second electrode connected to the second electrode of the capacitive element C2 and the n-th gate line GLn. Accordingly, the output of the second electrode of the transistor TR5 constitutes the driving part output V7. Since the common scanning signal V5 is 0V at the timing T1, the driving part output V7 becomes 0V (driving part output V7=common scanning signal V5=0V).

At the timing T2, the common scanning signal V5 is changed from 0V to 20V. Here, since the transistor TR5 is in the ON state, the driving part output V7 is also elevated. Then, the voltage V6 of the gate electrode of the transistor TR5 is elevated along with the elevation of the driving part output V7 due to the capacitive element C2. Due to the elevation of the voltage V6 of the gate electrode of the transistor TR5, the transistor TR5 can output the further higher voltage to the driving part output V7. Accordingly, the voltage V6 of the gate electrode is further elevated through the capacitive element C2. Such a bootstrap operation is generated in a short time and, eventually, the voltage V6 of the gate electrode assumes 28V (8V+20V=28V) and the driving part output V7 assumes 20V.

At the timing T3, the common scanning signal V5 is changed from 20V to 0V. Here, since the transistor TR5 is in the ON state, the driving part output V7 assumes 0V. The voltage V6 of the gate electrode also returns to 8V from 28V.

At the timing T4, the shift register output V1n assumes 0V. Since the transistor TR4 is in the ON state, the voltage of the gate electrode V6 becomes 0V (voltage V6=shift register output V1n=0V). Accordingly, the transistor TR5 assumes the OFF state.

Since the shift register output V1 is 0V before the timing T1 and after the timing T4, the transistor TR5 is in the OFF state. Accordingly, although a period in which the common scanning signal TR5 assumes 20V is present within these periods, the booster circuit 101 is not operated and hence, the scanning signal is not outputted to the gate line GLn.

Due to such a constitution, the scanning signal which is inputted within the period in which the shift register output V1n is inputted is selected among the common scanning signals V5 and the scanning signal is outputted to the corresponding gate line GLn. Here, since the driving voltage of the shift register 100 is set lower than the voltage amplitude of the scanning signal, the power consumption can be reduced. Further, since the common scanning signal V5 is prepared separately from the shift register output V1n, for example, the length and the voltage amplitude of the common scanning signal V5 can be freely changed without depending on the waveform of the shift resister output whereby the freedom of designing is enhanced such that the redesigning of the shift resister is no more necessary.

Figure 21:
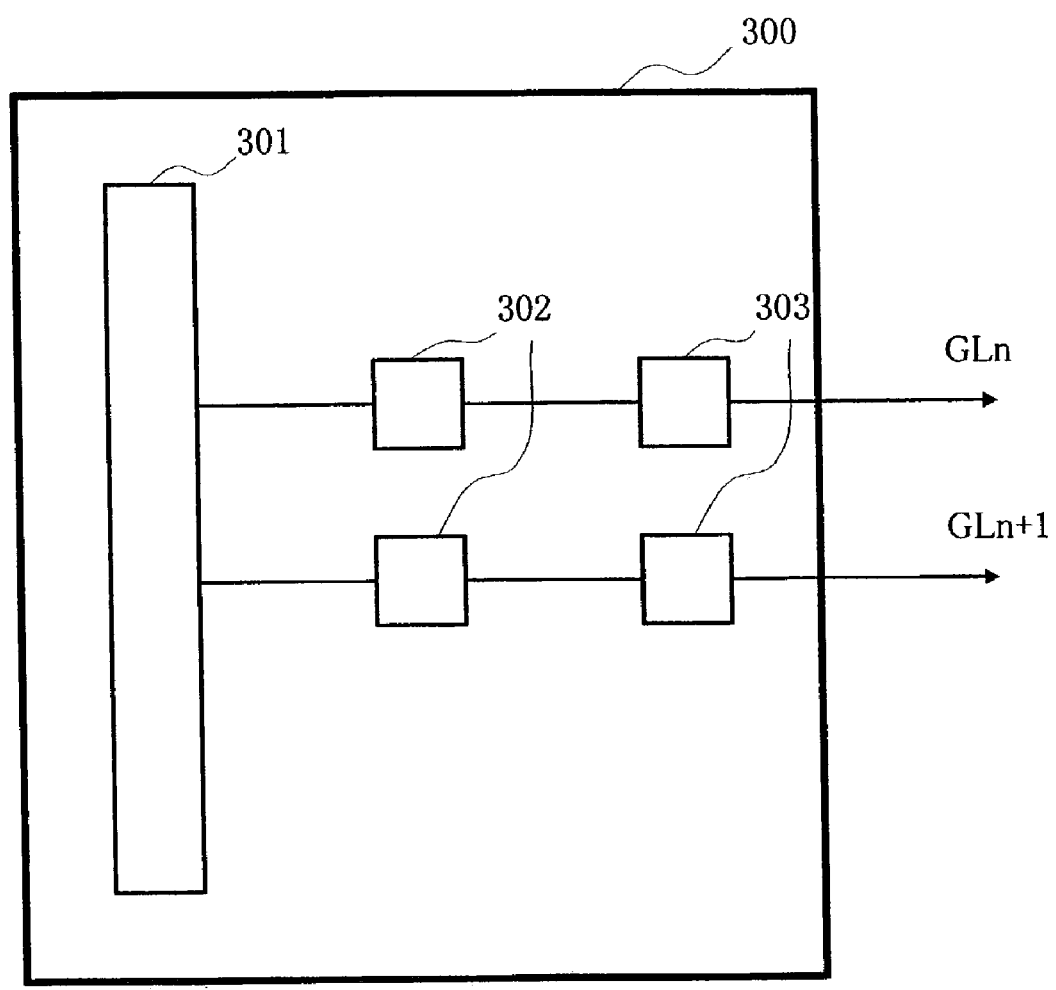
FIG. 21 is a view for showing one example of a conventional scanning driving circuit.

Further, although the degradation such as the dullness of waveforms occurs to some degree, the degree is low and hence, it is possible to output the scanning signal having a waveform and a voltage amplitude substantially equal to those of the common scanning signal V5 to the gate line GLn. In the level shifters 302 which use the COMS circuits as shown in FIG. 21, the rounding occurs in waveforms and hence, it is necessary to eliminate the rounding. According to the constitution of this embodiment, the level shifter 302 is unnecessary so that the rounding of waveforms is small whereby the buffer 303 is also unnecessary. Further, since the capacitive element C2 for bootstrap is connected to the driving part output V7, the driving part DRVn can perform the bootstrap operation using own output.

Subsequently, the operation of the reset circuit 102 is explained.

At the timing T1, the shift register output V1n is changed from 0V to 10V as shown in FIG. 7 and the clock V2 is changed from 0V to 10V. Here, the transistor TR2 assumes the ON state and the inverting signal V4 assumes 0V (inverting signal V4=OFF potential VS=0V). Although the voltage V3 is elevated in synchronism with the clock V2 due to the capacitive element C1, the voltage V3 is saturated at 2V which is made elevated from the inverting signal V4 by an amount of 2V which is the threshold value due to a diode which is constituted of the transistor TR1 and the transistor TR1 assumes the OFF state.

At the timing T5, the clock V2 is changed from 10V to 0V. Here, the voltage V3 is also lowered due to the capacitive element C1 and assumes a value lower than −2V. Then, the transistor TR3 which constitutes a diode assumes the ON state and the voltage V3 is saturated at −2V (voltage V3=OFF voltage VS−threshold value 2V=0V−2=−2V) and the transistor TR3 assumes the OFF state.

At the timing T4, the shift resistor output V1n is changed from 10V to 0V and the clock V2 is changed from 0V to 10V. Here, the transistor TR2 assumes the OFF state. Further, due to the capacitive element C1, the voltage V3 is elevated from −2V by an amount of 10V in synchronism with the clock V2 to assume 8V. Then, the transistor TR1 which constitutes the diode assumes the ON state and the inverting signal V4 is saturated at 6V which is lowered by an amount of 2V of the threshold value and the transistor TR1 assumes the OFF state. The inverting signal V4 is set to 6V even before the timing T1.

At the timing T6, the clock V2 is changed from 10V to 0V. At this point of time, the voltage V3 is lowered by an amount of 10V due to the capacitive element C1 so as to assume −2V. Here, the transistor TR1 which constitutes the diode remains in the OFF state and the transistor TR2 is also in the OFF state and hence, the inverting signal V4 is unchanged and remains at 6V.

Due to the above-mentioned operation, the inverting signal V4 is generated based on the shift register output V1n, wherein when the shift register output V1n is present, the inverting signal V4 assumes 0V, while when the shift register output V1n is not present, the inverting signal V4 assumes 6V. When the inverting signal V4 is at 6V, the transistor TR6 assumes the ON state and the transistor TR7 also assumes the ON state and hence, the OFF potential VS is outputted to the driving part output V7 so that the driving part output V7 assumes 0V. In this manner, the transistor TR5 of the booster circuit 101 and the transistor TR6 of the reset circuit 102 are subjected to an exclusive control, wherein by outputting the OFF potential VS from the reset circuit 102 during the period that that the booster circuit 101 is not operated, the gate line GLn is prevented from becoming a floating state.

Subsequently, the changeover switch circuit is explained.

Figure 8:
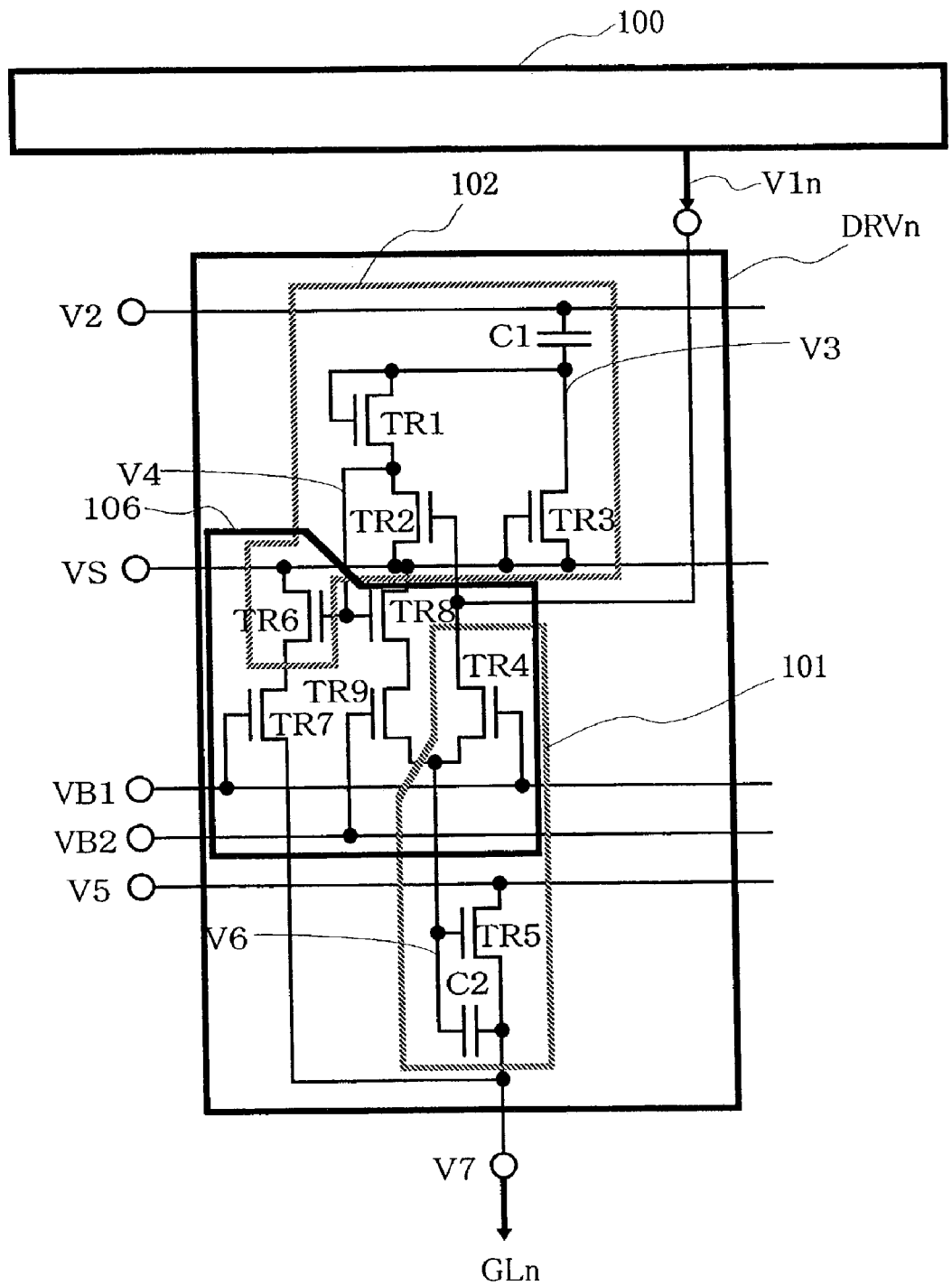
FIG. 8 is a view for explaining one example of the circuit constitution of a changeover switch circuit of the driving part in the first embodiment of the present invention.
Figure 9:
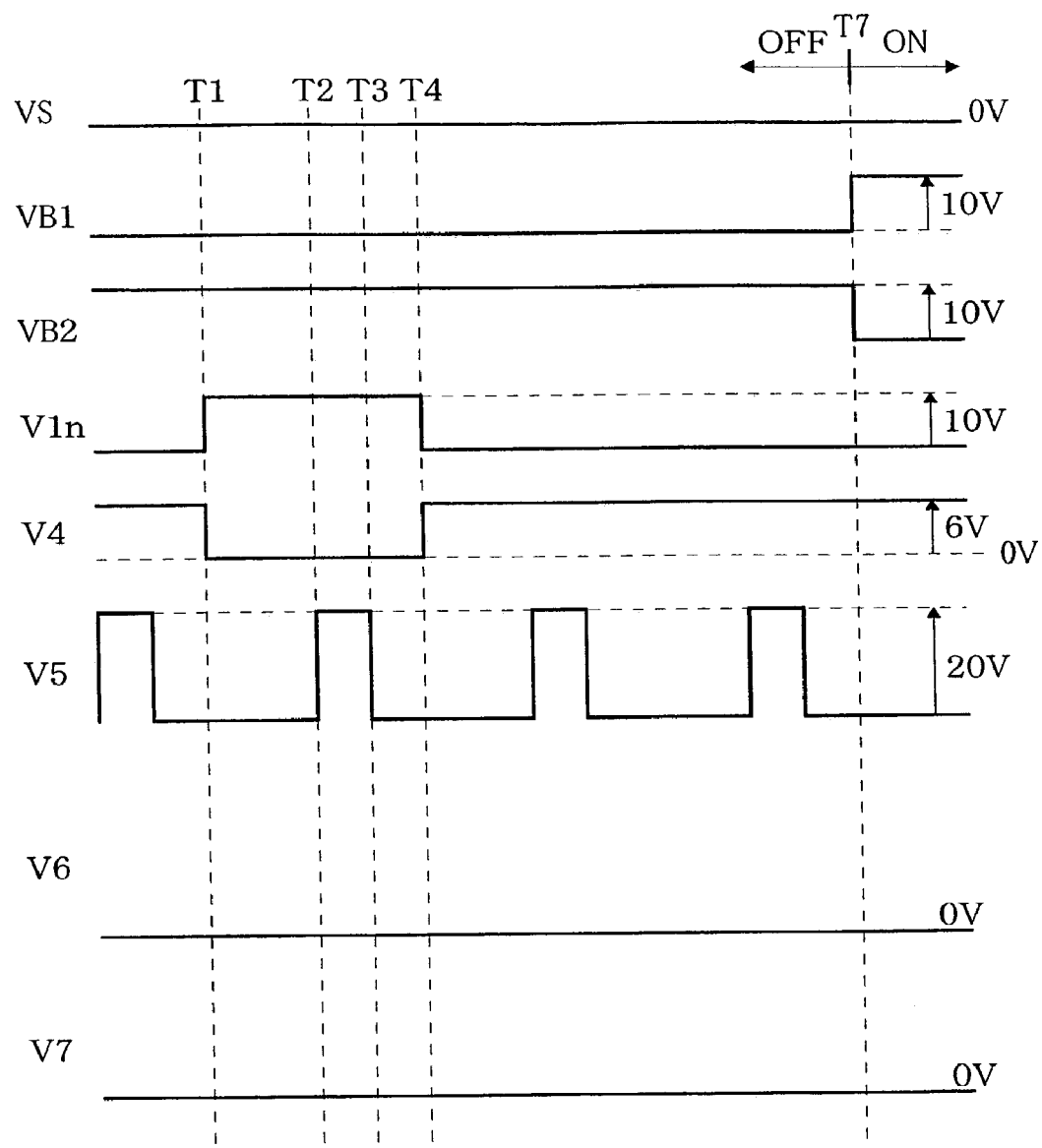
FIG. 9 is a waveform diagram for explaining one example of the manner of operation of the circuit of the driving part shown in FIG. 8.

FIG. 8 is a view showing one example of the circuit constitution of a changeover switch circuit of the driving part according to the first embodiment of the present invention. FIG. 9 is a waveform diagram showing one example of the manner of operation of the circuit of the driving part shown in FIG. 8.

As shown in FIG. 8, a driving part DRVn has a changeover switching circuit 106. The circuit shown in FIG. 8 is as same as the circuit shown in FIG. 5 and only a portion of the circuit which corresponds to the changeover switch circuit 106 is indicated by a surrounding line. The changeover switch circuit 106 includes transistors TR4, TR6, TR7, TR8 and TR9. Among these transistors, the transistor TR4 is shared commonly by the changeover switch circuit 106 and the booster circuit 101, while the transistor TR6 is shared commonly by the changeover switch circuit 106 and the reset circuit 102.

Subsequently, the manner of operation of the changeover switch circuit is explained in conjunction with FIG. 9.

As shown in FIG. 9, until the timing T7 comes, the changeover switch signal VB1 is set to the ground potential, that is, 0V and the changeover switch signal VB2 constitutes a DC voltage signal of 10V. This preceding period before the timing T7 constitutes an OFF period which stops the operation of the booster circuit 101. On the other hand, after the timing T7 comes, the changeover switch signal VB1 constitutes a DC voltage signal of 10V and the changeover switch signal VB2 assumes the ground potential of 0V. The period which comes after the timing T7 constitutes an ON period which allows the operation of the booster circuit 101.

In the OFF period, the changeover switch signal VB1 assumes 0V. Accordingly, the transistor TR4 is in the OFF state. Accordingly, even when the shift register output V1n is inputted at the timing T1, the voltage V6 is not changed and hence, the transistor TR5 holds the OFF state. Further, the transistor TR7 also holds the OFF state since the changeover switch signal VB1 assumes 0V. Further, since the changeover switch signal VB2 is at 10V, the transistor TR9 assumes ON state. Thereafter, when the inverting signal V4 assumes 6V at the timing T4, the transistor TR8 assumes the ON state and the voltage V6 assumes 0V which is equal to the OFF potential. Accordingly, the transistor TR5 is held at the OFF state and the output of the common control signal V5 is not outputted to the driving part output V7. In this manner, the operation of the booster circuit 101 is stopped in the OFF period. Further, since both of the transistors TR5, TR7 are in the OFF state, the driving output V7 assumes a floating state.

On the other hand, in the ON period, the operation of the booster circuit 101 is allowed and the manner of operation is performed exactly in the same manner as described in FIG. 5 to FIG. 7.

The use of such a changeover switch circuit 106 brings about following advantageous effects. That is, the output of the shift register 100 is unstable immediately after the electricity is supplied and hence, there may be a case that the outputting is started from a position other than the first outputting position. There may be also a case in which the number of such other outputting positions is not limited to one place and the outputting may be started at a plurality of outputting terminals. However, when the scanning of the shift register 100 is performed one cycle or more in the state that the operation of the booster circuit 101 is stopped by the changeover switch circuit 106 before the display is started, such an abnormal outputting is eliminated. Thereafter, the changeover switch circuit 106 allows the operation of the booster circuit 101 so that the display of the display device is started.

Further, with the use of such a changeover switch circuit 106, when two scanning driving circuits 10 are provided as shown in FIG. 3, it is possible to set only one-side scanning driving circuit 10 to the OFF state using the changeover switch circuit 106 and to set only another scanning driving circuit 10 to the ON state using the changeover switch circuit 106 so as to enable the operation of the another scanning driver circuit 10. In this case, the outputting of the scanning driving circuit held at the OFF state is in the floating state and hence, the outputting does not influence the operation of one-side scanning driving circuit 10. Accordingly, even when a trouble occurs with respect to one-side scanning driving circuit 10, the driving is ensured by another scanning driving circuit 10 and hence, the yield rate is enhanced.

The manner of operation of the whole scanning driving circuit 10 is explained.

Figure 10:
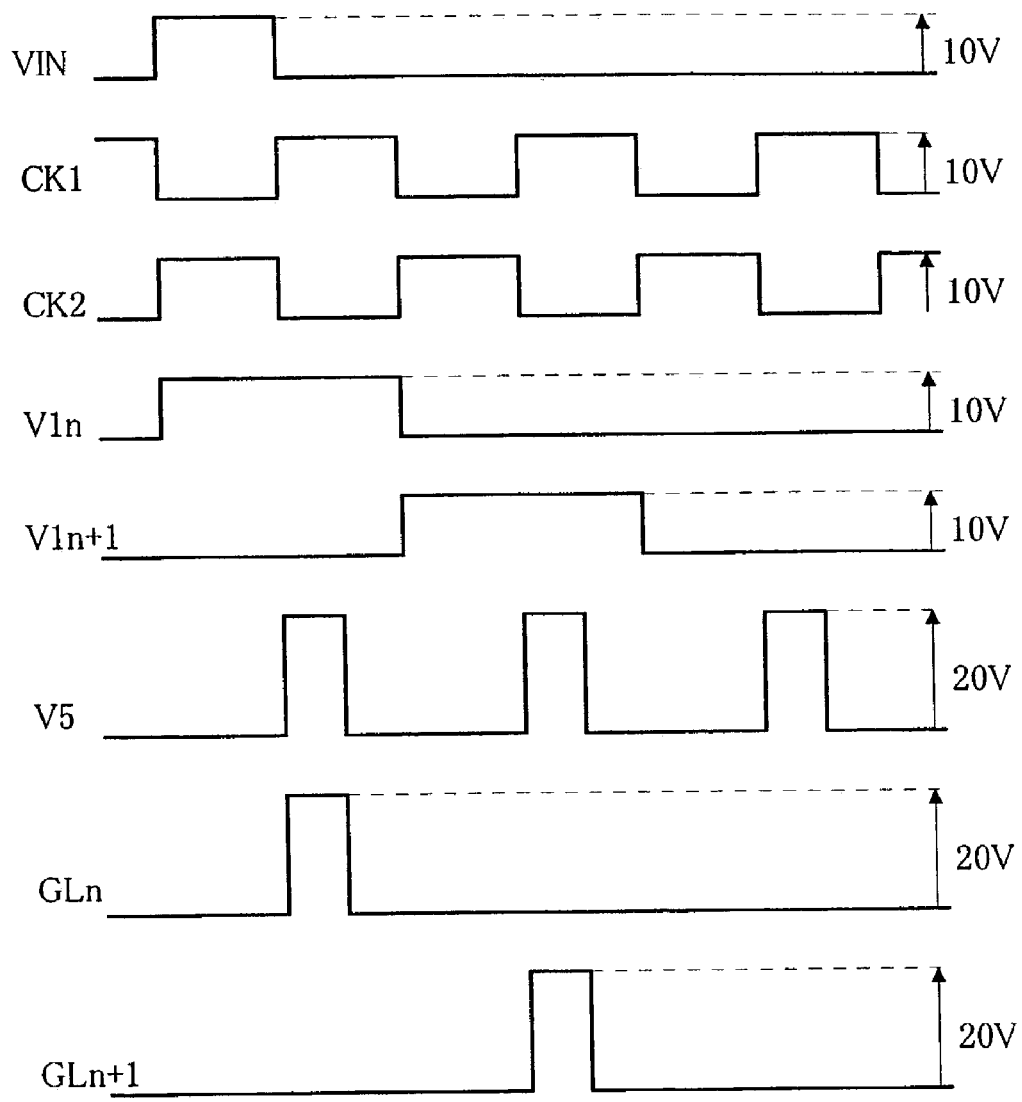
FIG. 10 is a waveform diagram for explaining one example of the manner of operation of a scanning driving circuit in the first embodiment of the present invention.

FIG. 10 is a waveform diagram showing one example of the manner of operation of the scanning driving circuit according to one embodiment of the present invention.

The shift register pulse VIN has a voltage amplitude of 10V. The clocks CK1, CK2 have a voltage amplitude of 10V and have phases opposite from each other. The shifting operation by the shift register 100 is performed in synchronism with these clocks CK1, CK2. The n-th shift register output V1$n$ and the (n+1)th shift register output V1$n$+1 have a voltage amplitude of 10V and these outputs are configured not to overlap each other time-sequentially. Here, although it is possible to take out the time-sequentially overlapped outputs from the shift register 100 as will be explained later, they are not taken out in an overlapped manner in this embodiment.

The common scanning signal V5 has a voltage amplitude greater than that of the shift register output V1 and such a voltage is set to 20V. Here, although a row of scanning signals are applied to the common scanning signal V5 during a period from a point of time that the scanning signal is applied to a specified n-th gate line GLn to a point of time that the scanning signal is applied to a next n-th gate line GLn, to the n-th gate line GLn, only the scanning signal which is present during the period in which the shift register output V1$n$ is inputted is selected and outputted. The same goes for the next (n+1)th gate line GLn+1. In this manner, the scanning is performed sequentially from the first line.

Second Embodiment

Figure 11:
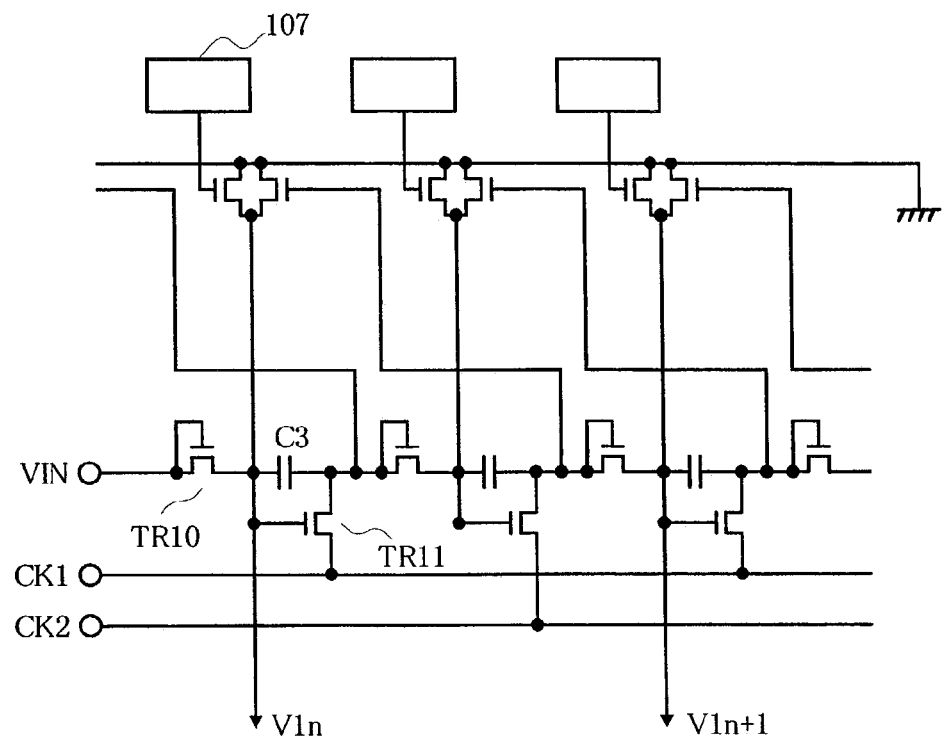
FIG. 11 is a view for explaining one example of the circuit constitution of a shift register in the second embodiment of the present invention.
Figure 12:
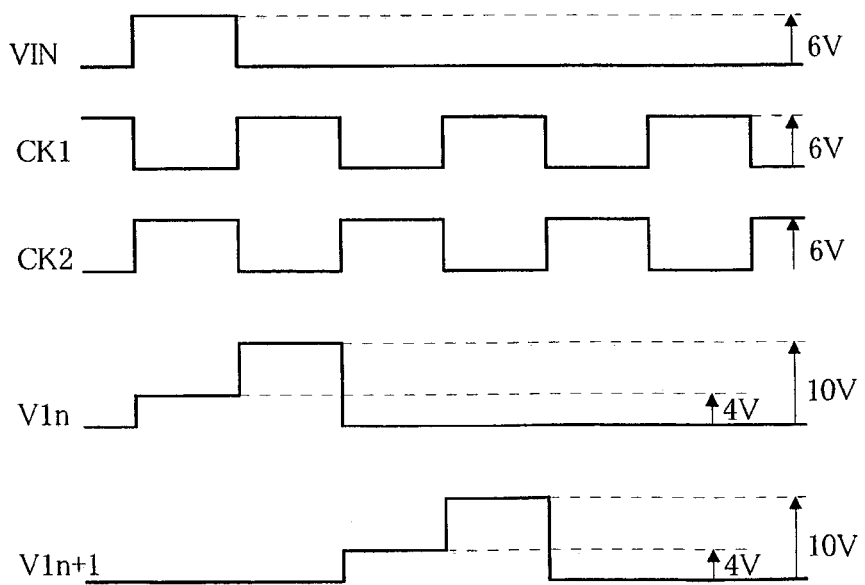
FIG. 12 is a waveform diagram for explaining one example of the manner of operation of the shift transistor shown in FIG. 11.

FIG. 11 is a view for explaining one example of the circuit constitution of the shift register according to the second embodiment of the present invention. FIG. 12 is a waveform diagram for explaining one example of the manner of operation of the shift register shown in FIG. 11.

In this embodiment, a point which makes this embodiment different from the first embodiment in particular lies in the constitution of the shift register 100 and the waveform of the output V1. The repeated explanation of portions identical with those of the first embodiment is omitted.

In FIG. 11, the shift register 100 includes transistors TR10 each of which constitutes a diode, a transistor TR11 and a capacitive element C3. Further, the shift register 100 includes other transistors and a pump up circuit 107. These transistors TR10, TR11 and the like are constituted of n-type polysilicon thin film transistors and have the same conductive-type single channel structure as the pixels and the driving part. The shift register 100 is integrally formed on the substrate SUB1 and has the single channel structure so that the number of manufacturing processes can be reduced.

Subsequently, the manner of operation of this embodiment is explained in conjunction with FIG. 12.

When the shift register start pulse VIN having an amplitude of 6V is inputted to the transistor TR10 which constitutes the first diode, the output V1$n$ is lowered by threshold value of 2V from 6V to assume 4V. Here, the transistor TR11 assumes the ON state. Then, in synchronism with the rise of the clock CK1 having an amplitude of 6V, the potential of the second electrode of the transistor TR11 is elevated. Along with such an elevation, the output V1$n$ is elevated to 10V due to the bootstrap operation through the capacitive element C3. Then, in synchronism with the fall of the clock CK1, the transistor TR11 assumes the OFF state and the output V1$n$ assumes 0V.

Then, in synchronism with the rise of the clock CK2, the shifting to a next stage is initiated.

Further, thereafter, in synchronism with the rise of the clock CK1, the shifting to a next stage is initiated and the outputting of the output V1$n$+1 is started.

Using these outputs V1$n$, V1$n$+1, the scanning signal is applied to the gate lines GL in the same manner as the first embodiment. In this manner, it is possible to apply the scanning signals having the substantially same waveform as the waveform of the common scanning signal V5 to the gate lines GL without dependent on the waveform of the shift register output.

According to this embodiment, even when the clocks CK1, CK2 which initiate the operation of the shift register 100 are set to 6V which is smaller than those used in the first embodiment, the shift register output V1 can obtain 10 V at maximum in the same manner as the first embodiment. Accordingly, this embodiment can further reduce the power consumption compared to the first embodiment.

Figure 13:
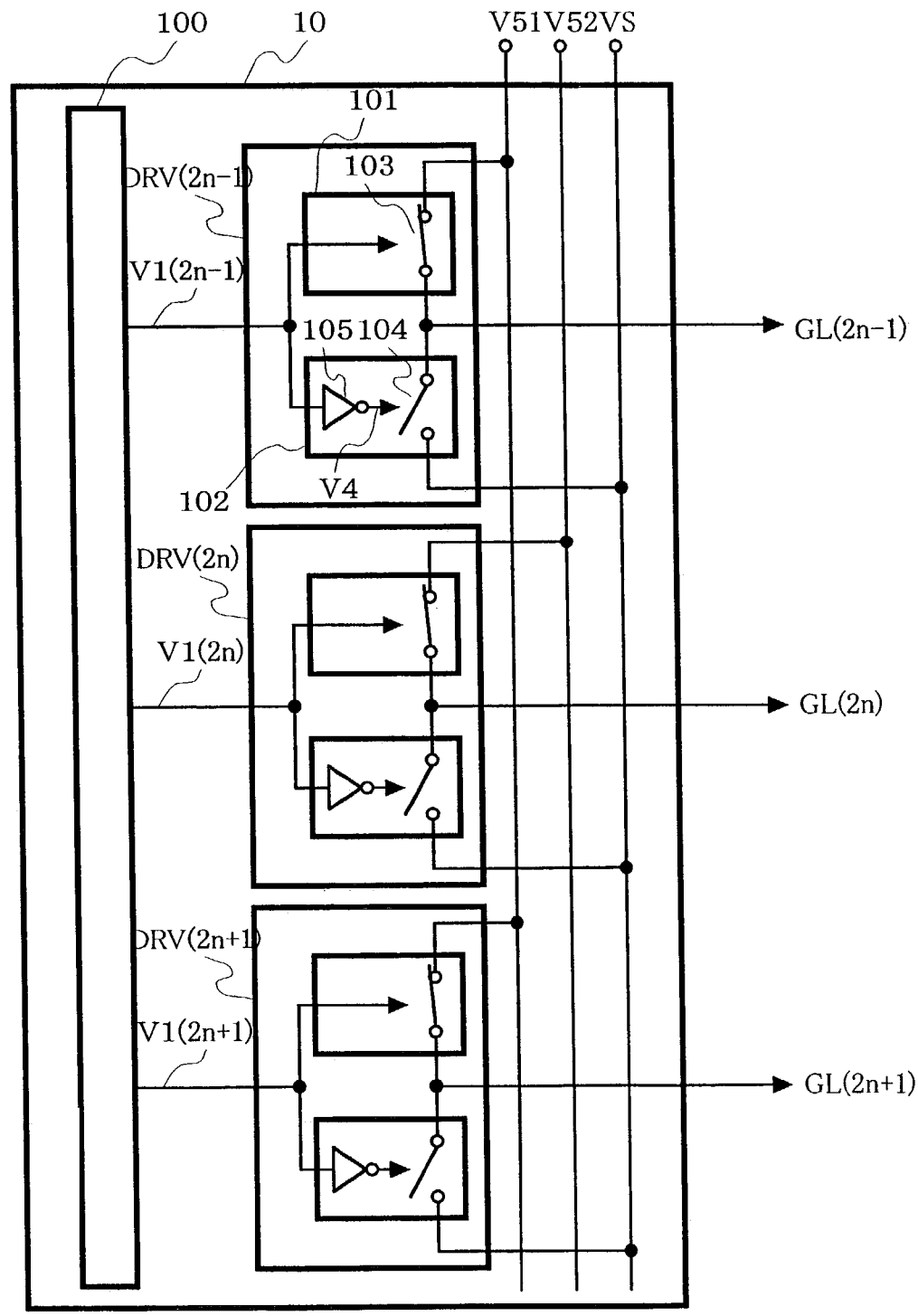
FIG. 13 is a view for explaining one example of the constitution of a scanning driving circuit in the third embodiment of the present invention.
Figure 14:
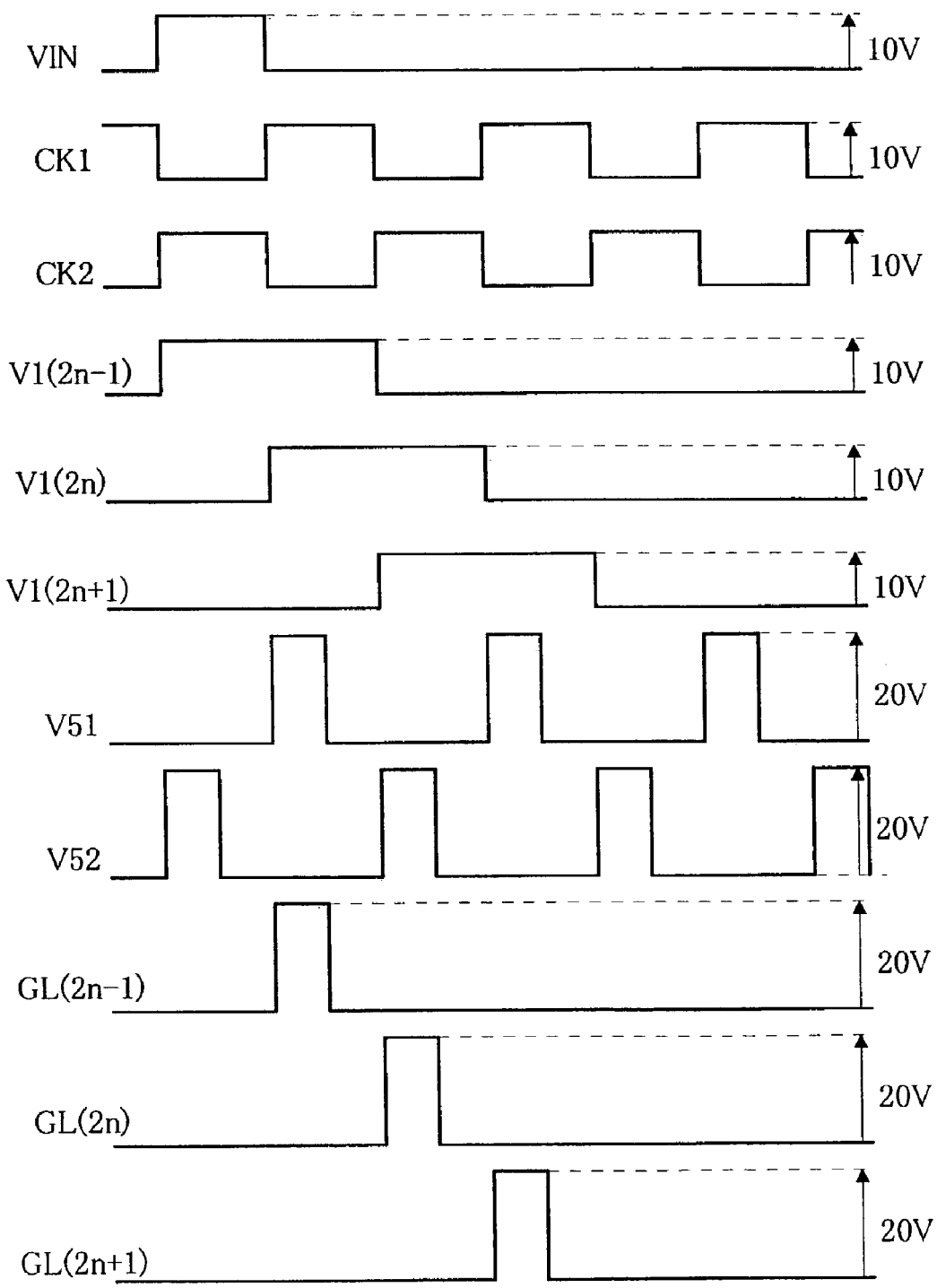
FIG. 14 is a waveform diagram for explaining one example of the manner of operation of the scanning driving circuit shown in FIG. 13.

FIG. 13 is a view for explaining one example of the constitution of a scanning driving circuit in the third embodiment of the present invention and FIG. 14 is a waveform diagram for explaining one example of the manner of operation of the scanning driving circuit show in FIG. 13.

What makes this embodiment different from the first embodiment shown in FIG. 4 in particular lies in that two kinds of common scanning signals V51, V52 are provided in place of the common scanning signal V5 and the booster circuits 101 are divided into two groups. Here, with respect to portions identical with the portions of respective embodiments which have been explained heretofore, the repeated explanation of these portions is omitted.

The first common scanning signal V51 is equal to the common scanning signal V5 shown in FIG. 4. On the other hand, the second common scanning signal V52 has a waveform which differs from the waveform of the first common scanning signal V51 in phase. In this embodiment, an example in which the phases are shifted by 180 degrees from each other is explained.

The odd-numbered output V1(2n−1) of the shift register 100 is inputted to the corresponding driving part DRV(2n−1). Then, the booster circuit 101 is operated in response to the first common scanning signal V51 and outputs the scanning signal to the gate line GL(2n−1). Further, with respect to other odd-numbered output V1(2n+1) or the like of the shift register 100, the output is inputted to the corresponding driving part DRV(2n+1). Then, the booster circuit 101 is operated in response to the first common scanning signal V51 and outputs the scanning signal to the corresponding gate line GL(2n+1) or the like.

On the other hand, the even-numbered output V1(2n) of the shift register 100 is inputted to the corresponding driving part DRV(2n). Then, the booster circuit 101 is operated in response to the second common scanning signal V52 and outputs the scanning signal to the gate line GL(2n). Further, although not shown in the drawing, with respect to other even-numbered output V1(2n+2) or the like of the shift register 100, the output is also inputted to the corresponding driving part DRV(2n) in the same manner. Then, the booster circuit 101 is operated in response to the second common scanning signal V52 and outputs the scanning signal to the corresponding gate line GL(2n) or the like.

In this manner, the booster circuits 101 of respective driving parts DRV are divided into two groups consisting of a first group in which the first common scanning signal V51 is inputted to the booster circuits 101 in common and a second group in which the second common scanning signal V52 is inputted to the booster circuits 101 in common and the booster circuits 101 belonging to the first group are excluded. In this embodiment, the booster circuits 101 which correspond to the odd-numbered gate lines GL belong to the first group and the booster circuits 101 which correspond to the even-numbered gate lines GL belong to the second group.

Here, as shown in FIG. 14, the shift register outputs V1(2n−1), V1(2n), V1(2n+1) are outputted in a state that these outputs partially overlap each other time-sequentially. That is, in this embodiment, the outputs of the shift register 100 which are not used in the first embodiment are taken out and are used. However, also in this case, it is possible to apply the scanning signal to the corresponding gate lines GL(2n−1), GL(2n), GL(2n+1).

According to this embodiment, compared to the first embodiment, even when the number of transistors used in the shift register is equal, by merely increasing the number of the common scanning signal by one, it is possible to scan the twofold number of the gate lines GL.

Fourth Embodiment

Figure 15:
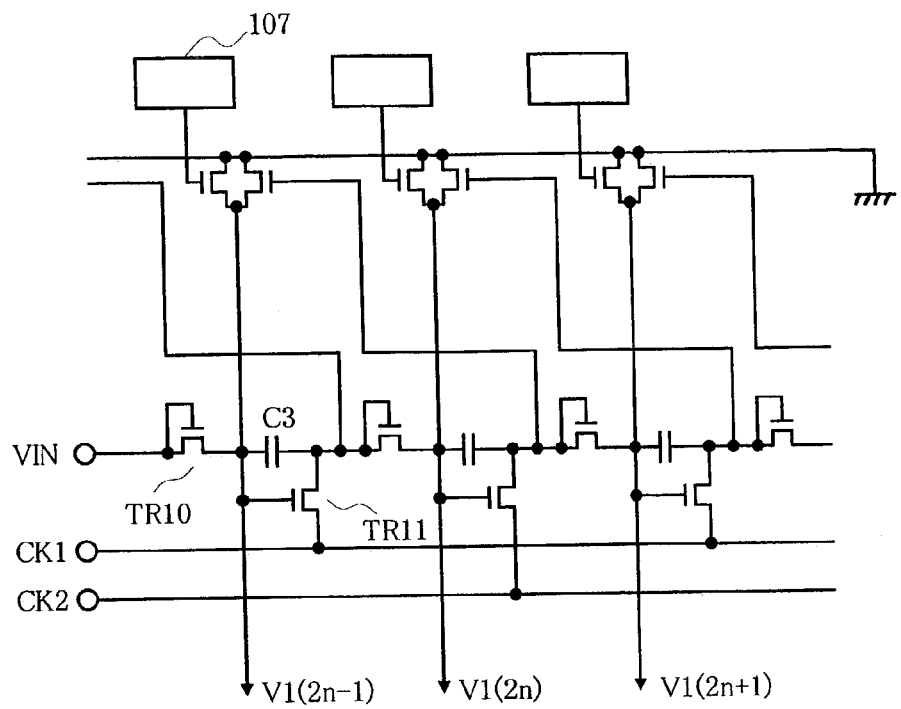
FIG. 15 is a view for explaining one example of the circuit constitution of a shift register in the fourth embodiment of the present invention.
Figure 16:
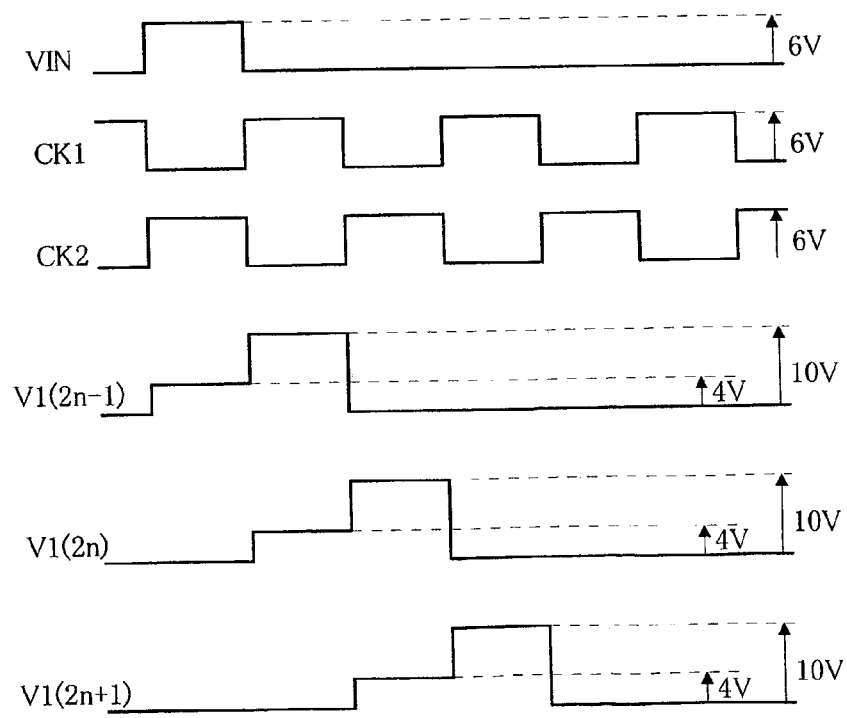
FIG. 16 is a waveform diagram for explaining one example of the manner of operation of the shift register shown in FIG. 15.

FIG. 15 is a view for explaining one example of the circuit constitution of a shift register according to the fourth embodiment of the present invention. FIG. 16 is a waveform diagram for explaining one example of the manner of operation of the shift register shown in FIG. 15.

This embodiment corresponds to a combined embodiment of the third embodiment shown in FIG. 13 and the second embodiment shown in FIG. 11. On the other hand, what makes this embodiment different from the second embodiment shown in FIG. 11 in particular lies in that, as shown in FIG. 15, the output V1(2n) is taken out from a place which is not used in the shift register 100 shown in FIG. 11. Due to such a constitution, even when the number of transistors which are used in the shift resister 100 is equal, it is possible to scan the twofold number of gate lines GL. Further, since all of the shift resister 100, the driving parts DRV, the pixels form the single channel structure, when the scanning driving circuit 10 is integrally formed on the substrate SUB1, the number of manufacturing processes can be reduced. Still further, since the driving voltage of the shift resister 100 is small, the power consumption can be reduced. In this embodiment, the repeated explanation of portions identical with the portions of respective embodiments which have been explained heretofore is omitted.

Fifth Embodiment

Subsequently, the video signal driving circuit 20 is explained.

Figure 17:
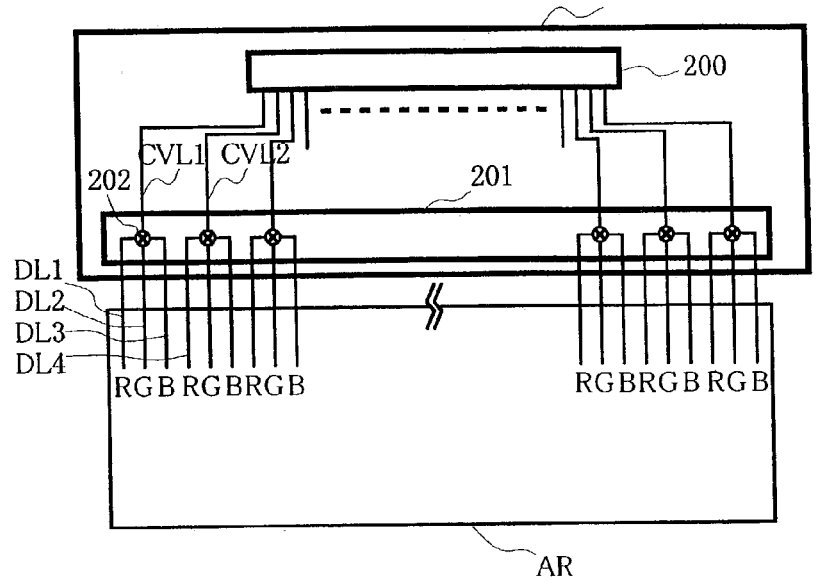
FIG. 17 is a view for explaining one example of the constitution of a video signal driving circuit of a display device in the fifth embodiment of the present invention.

FIG. 17 is a view for explaining one example of the constitution of the video signal driving circuit in the fifth embodiment of the display device according to the present invention.

The video signal driving circuit 20 of this embodiment adopts a time-division method.

The video signal driving circuit 20 includes a drain driver 200 and a video signal circuit 201. The drain driver 200 includes one, two or more driving IC chips and is mounted by a tape automated bonding method (TAB). However, the manner of mounting is not limited to this method and the IC chips may be mounted on the substrate SUB1. Further, it is possible to adopt a method in which the IC chips may be mounted on any suitable place other than the substrate SUB1, for example, on the printed circuit board PCB1 or on the flexible printed circuit board (FPC) or the like. On the other hand, the video signal circuit 201 is integrally formed on the substrate SUB1. The video signal circuit 201 includes distributing circuits 202. With respect to the drain lines DL (DL1, DL2, DL3, DL4, . . . ), three neighboring drain lines DL constitute a set and these sets are connected to respective distributing circuits 202. One set of these drain lines DL includes respective one drain lines D1 which respectively correspond to red (R), green (G) and blue (B).

Respective outputs of the drain drivers 200 are inputted to the distributing circuits 202 through the common video signal lines CVL (CVL1, CVL2, . . . ). The drain driver 200 outputs the video signals which respectively correspond to three pixels of red (R), green (G) and blue (B) by time-division from the first output terminal to the first common video signal line CVL1 during one horizontal period for scanning the gate line GL by one line. Then, the distributing circuit 202 distributes these video signals outputted respectively by time-division to the drain lines DL1, DL2, DL3 of R, G, B corresponding to the video signals. In the same manner, from the second output terminal of the drain driver 200, the video signals are outputted by time-division to the second common video signal line CVL2 and are distributed to a next set of drain lines DL4, DL5, DL6 by the distributing circuit 202. The same goes for outputting of video signals by ensuing drain drivers 200 including the third drain driver 200 and other drain drivers which follow the third drain driver 200.

Although a set of drain lines is constituted of three drain lines, a set can be constituted of two or more drain lines. The drain driver 200 outputs video signals to be applied to two or more drain lines DL included in the set to the common video signal lines CVL by time-division and the distributing circuits 202 distribute the video signals outputted to the common video signal lines CV1 by time-division to the corresponding drain lines DL.

Figure 18:
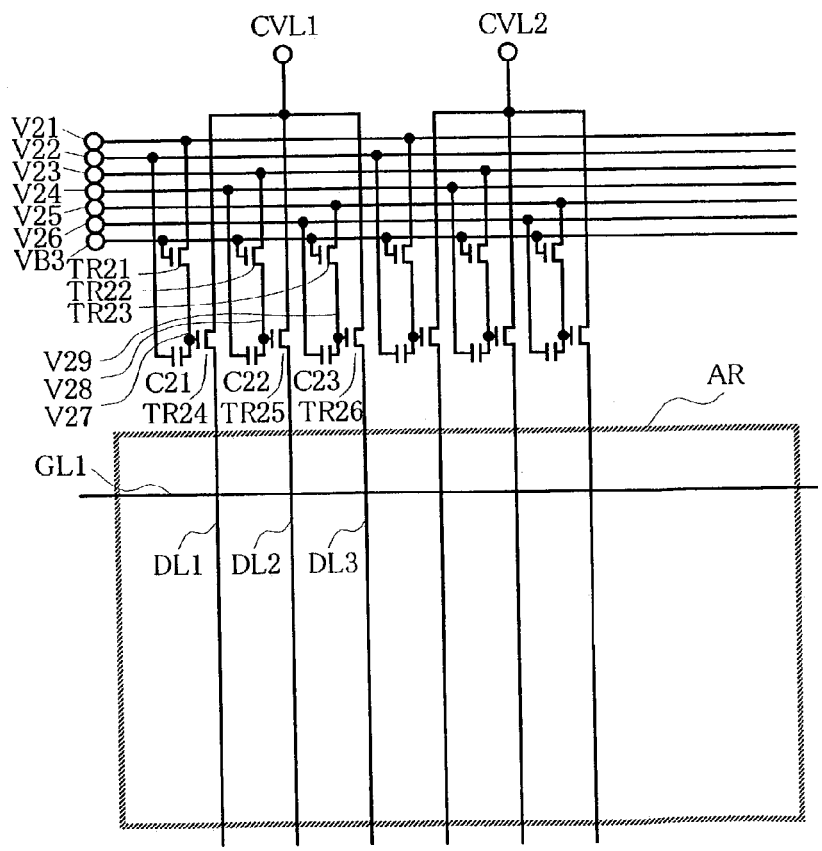
FIG. 18 is a view for explaining one example of distributing circuit shown in FIG. 17.
Figure 19:
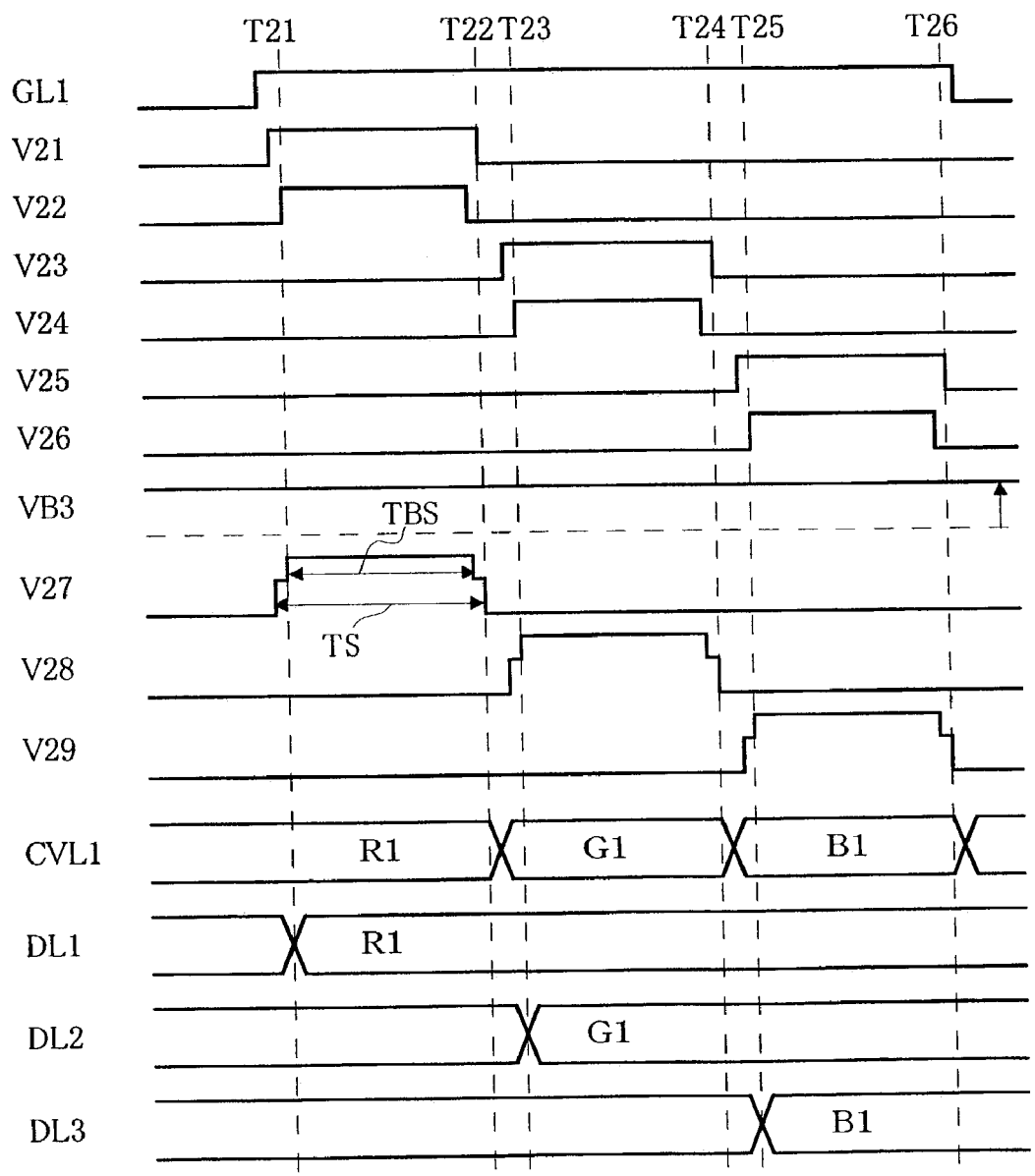
FIG. 19 is a waveform diagram for explaining one example of the manner of operation of a circuit shown in FIG. 18.

FIG. 18 is a view showing one example of the distributing circuits shown in FIG. 17. FIG. 19 is a waveform diagram for explaining one example of the manner of operation of the circuit shown in FIG. 18.

The explanation is made by focusing on the distributing circuit 202 which distributes the video signal from the first common video signal line CVL1 to three drain lines DL1, DL2, DL3. During a period that the scanning signal is applied to the first gate line GL1, the drain driver 200 outputs the video signals R1, G1, B1 respectively corresponding to red, green and blue pixels to the common video signal line CVL1 by time-division. In this embodiment, the explanation is made provided that the maximum voltage amplitude of the video signals is 12V.

The distributing circuit 202 performs a distribution control by inputting a twofold number (6 pieces) of distribution control signals V21 to V26 compared to the number (3 pieces) of drain lines DL1, DL2, DL3 corresponding to one common video signal line CVL1. In this embodiment, the voltage amplitude of the distribution control signals is set to 10V.

The distributing circuit 202 includes transistors TR24, TR25, TR26 which play roles of switches. These transistors TR24, TR25, TR26 have respective first electrodes thereof connected to the common video signal lines CVL1 and respective second electrodes thereof connected to the corresponding drain lines DL1, DL2, DL3, wherein the voltages of the respective gate electrodes are controlled based on corresponding two pieces out of six pieces of the distribution control signals V21 to V26.

The distribution of the video signals to the drain lines DL1 is controlled by the transistor TR24, two distribution control signals V21, V22, the transistor TR21, and the capacitive element C21.

It is necessary to input a voltage which is sufficiently larger than the voltage amplitude of the video signals to the gate electrode of the transistor TR24. When the inputting voltage is small, it is impossible to apply the correct video signals to the drain line DL1 due to the ON resistance of the transistor TR24. When the distribution control signal is a signal which has a sufficiently large voltage, it is sufficient to use only one distribution control signal with respect to one drain line and to input such a distribution control signal to the gate electrode of the transistor TR24 directly. However, in this embodiment, since the control is performed using the distribution control signal having the voltage amplitude which is equal to or less than the sum of the maximum voltage amplitude of the video signals and the threshold value voltage of the transistor TR24, following considerations are made.

With respect to the transistor TR21, a DC voltage signal VB3 is inputted to the gate electrode and the distribution control signal V21 is inputted to the first electrode. The capacitive element C21 has a first electrode thereof connected to the distribution control signal V22 and a second electrode thereof connected to a second electrode of the transistor TR21 and a gate electrode of the transistor TR24. Here, in this embodiment, the DC voltage signal VB3 uses 10V in the same manner as the voltages of the distribution control signals V21 to V26.

First of all, when the distribution control signal V21 is inputted, the voltage V27 of the gate electrode of the transistor TR24 assumes 8V by subtracting the threshold value 2V from 10V. Subsequently, when the distribution control signal V22 is inputted at the timing T21, the voltage V27 is further elevated through the capacitive element C21 by another 10V from the current 8V to assume 18V. Then, the transistor TR21 assumes the OFF state. Here, the gate electrode of the transistor TR24 is at 18V which is sufficiently larger than 14 V obtained by adding the threshold value voltage 2V of the transistor TR24 to 12V which is the maximum voltage amplitude of the video signal R1 and hence, the video signal R1 is applied to the drain line DL1. When the distribution control signal V22 assumes 0V, the voltage V27 returns to 8V through the capacitive element C21. When the voltage V21 assumes 0V at the timing T22, the voltage V27 assumes 0V and the transistor TR24 assumes the OFF state.

In this manner, the voltage of the gate electrode of the transistor TR24 is elevated to the first voltage 8V in response to one of two corresponding distribution control signals V21, V22 and then is further elevated to the second voltage 18V which is higher than the first voltage in response to the other of two distribution control signals V21, V22. That is, the second voltage is controlled to a voltage which is larger than the sum of the maximum value of the voltage of the video signal R1 and the threshold voltage of the transistor TR24 and is larger than the voltage of the distribution control signals V21, V22.

The distribution of video signals to the drain lines DL2, DL3 is also controlled in the same manner as the distribution control of video lines to the drain line DL1. Here, the transistors TR25, TR26 respectively correspond to the transistor TR24, the transistors TR22, TR23 respectively correspond to the transistor TR21, the capacitive elements C22, C23 respectively correspond to the capacitive element C21, the distribution control signals V23, V25 respectively correspond to the distribution control signal V21, and the distribution control signals V24, V26 respectively correspond to the distribution control signal V22. Here, the distribution is performed by shifting the timing of the distribution control signals V21 to V26 in response to the time-division of the drain driver 200.

The same goes for the second common video signal line CVL2 and ensuing common video signal lines CVL which come after the second common video signal line CVL2. Here, the distribution control signals V21 to V26 are used in common with respect to the distributing circuits corresponding to two or more common video signal lines CVL.

The transistors TR21 to TR26 are constituted of polysilicon thin film transistors and are integrally formed on the substrate SUB1. The transistors have the same conductive pattern as the thin film transistors served for the pixels.

Accordingly, it is possible to provide the single channel constitution and hence, the number of manufacturing processes can be reduced.

Here, it is possible to suitably change the specific values of voltages without departing from the technical concept of the present invention. The circuit constitution and the waveforms of the distribution control signals V21 to V26 are not limited to the example shown in FIG. 18 and FIG. 19 and can be also suitably changed.

In this embodiment, it is necessary to write the video signals for three pixels by time-division within a period in which one scanning signal is applied and hence, the fast response is required. Accordingly, when the period in which the voltage of the gate electrode of the transistor TR24 assumes the first voltage of 8V or more is defined as a selection period TS and the period in which such a voltage assumes the second voltage of 18V is defined as a bootstrap period TBS, it is preferable that the bootstrap period TBS is longer than 50% of the selection period TS and it is more preferable that the bootstrap period TBS is equal to or more than 75% of the selection period TS.

Here, this embodiment may be combined with the first to fourth embodiments or may be used in a single form. As an opposite case, the first to fourth embodiments may be respectively in a single form or may be combined with this embodiment.

Sixth Embodiment

Figure 20:
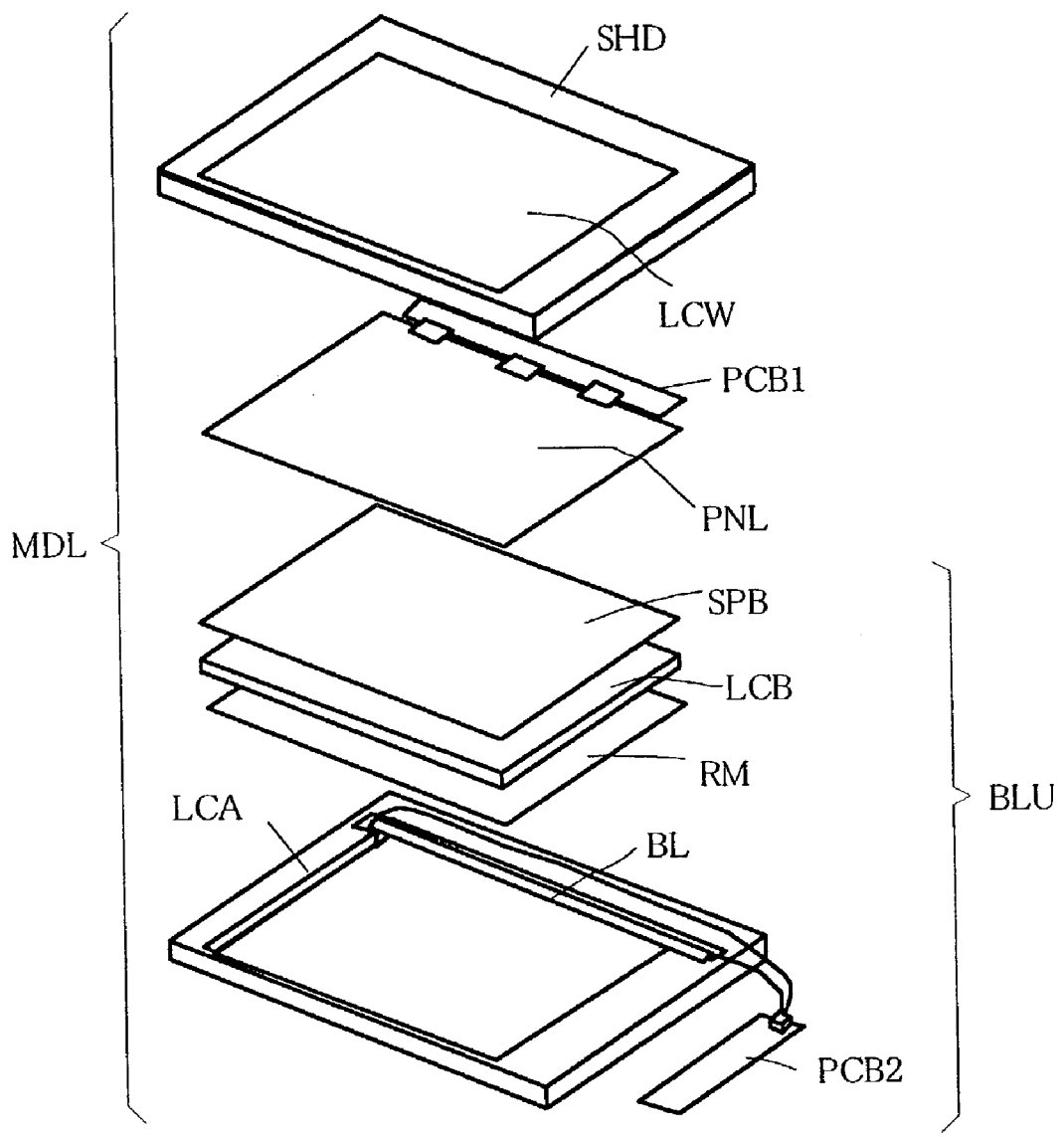
FIG. 20 is a developed perspective view showing one example of a display device according to the present invention.

FIG. 20 is a developed perspective view showing one example of the display device according to the present invention.

A liquid crystal display panel PNL uses any one of the first to fifth embodiments or the combination of two or more of these embodiments. The liquid crystal display panel PNL uses either a transmission type liquid crystal display panel or a semi-transmission type liquid crystal display panel. A shield case SHD having a display window LCW and being made of metal, for example, is arranged at a display surface side of the liquid crystal display panel PNL. At a back surface of the liquid crystal display panel PNL, a backlight unit BLU is arranged. With respect to the backlight unit BLU, a light diffusing plate SPB, a light guide body LCB, a reflector RM, a backlight light source BL, and an inverter printed circuit board PCB are accommodated in a backlight case LCA. The inverter printed circuit board PCB supplies electricity to the backlight light source BL. Then, light emitted from the backlight light source BL which is arranged at a side face of the light guide body LCB is formed into a planar light source through the light diffusing plate SPB, the light guide body LCB and the reflector RM and is irradiated from a back face of the liquid crystal display panel PNL.

With respect to the liquid crystal display module MDL, the shield case SHD, the liquid crystal display panel PNL and the backlight unit BLU are overlapped in accordance with the arrangement shown in the drawing and, thereafter, the whole liquid crystal display module MDL is fixed by engaging pawls and hooks formed on the shield case SHD each other.

The constitution of the liquid crystal display module MDL and the constitution of the backlight unit BLU are not limited to the above-mentioned constitutions. That is, these constitutions can be suitably changed by adopting a prism sheet or the like, for example. Further, although the embodiment has been explained in conjunction with the example which uses the sidelight type backlight unit BLU, it is possible to use a direct type backlight unit BLU which arranges a plurality of backlight light sources on the back face of the liquid crystal display panel PNL without using the light guide body LCB. Further, it is possible to use a reflective-type liquid crystal display panel as the liquid crystal display panel PNL, wherein a front light unit which irradiates the liquid crystal display panel PNL from a display surface side is used in place of the backlight unit BLU.

The above-mentioned respective embodiments have been explained in conjunction with the case in which the n-type thin film transistors are used. However, the respective circuits may be constituted of p-type thin film transistors. In this case, the circuit constitution and the waveforms of signals are suitably changed.

For example, with respect to the fifth embodiment, in FIG. 19, the voltage V27 of the gate electrode of the transistor TR24 assumes the highest value when the transistor TR24 assumes the OFF state, is lowered to the first voltage in response to one of two corresponding distribution control signals V21, V22, and is lowered to the second voltage which is lower than the first voltage in response to the other of two corresponding distribution control signals V21, V22. Since it is necessary to ensure the lowermost ON voltage when the voltage of the video signals assumes the minimum value, the second voltage is controlled to a voltage which is smaller than the sum of the minimum value of the voltage of the video signals and the threshold value voltage of the thin film transistor (in this case, −2V, for example) and is smaller than the voltages of the distribution control signals V21, V22. Accordingly, the sufficient switching operation of the transistor TR24 can be ensured. The selection period TS is defined as a period in which the voltage V27 assumes a value equal to or below the first voltage and the bootstrap period TBS is defined as a period in which the voltage V27 assumes the second voltage. Although modifications other than the above-mentioned modifications may be added when necessary, since the content of these modifications are considered self-explanatory and hence, the explanation of these modifications is omitted.

Further, although the above-mentioned respective embodiments have been explained in conjunction with the examples illustrating the specific circuits of the shift register 100, the circuits are not limited to these circuit constitutions. The term "shift register 100" in this specification includes any circuit which performs the sequential outputting of scanning signals.

Further, although the display device of the present invention has been explained in conjunction with the liquid crystal display device as the example, the display device is not limited to the liquid crystal display device and the present invention is applicable to a display device of other type such as an organic EL display device, for example.

As has been described heretofore, according to the scanning driving circuit of the present invention, it is possible to provide the display device having the scanning driving circuit which exhibits high degree of freedom in designing of waveforms of the scanning signals while ensuring the reduction of the power consumption.

Further, according to the video signal driving circuit of the present invention, it is possible to provide the display device having the video signal driving circuit which can apply the video signals with small degradation to the drain lines and can exhibit the small power consumption while enabling the reduction of number of outputting pins of the driver IC.

Further, it is also possible to provide the display device which can reduce the number of manufacturing processes by adopting the single channel constitution.

What is claimed is:

1. A display device comprising:
a substrate;
a plurality of gate lines formed on the substrate;
a plurality of drain lines formed on the substrate and crossing the plurality of gate lines;
a plurality of pixels comprising thin film transistors which are connected to the gate lines and the drain lines;
a scan circuit formed on the substrate and to apply scan signals to the gate lines; and
a control circuit to supply control signals to the scan circuit,
wherein the scan circuit comprises a shift register which generates outputs corresponding to the plurality of gate lines and a plurality of drive circuits which output the scan signal to the corresponding gate line based on the outputs of the shift register,
wherein a common scan signal, which comprises a voltage amplitude larger than a voltage amplitude of the outputs of the shift register, is inputted to at least two of said drive circuits in common from the control circuit, and
wherein each drive circuit comprises a booster circuit to which the output of the shift register and the common scan signal are inputted, and the booster circuit selects the common scan signal which is inputted during a period in which the output of the shift register is inputted, and outputs the scan signal comprising the voltage amplitude larger than the voltage amplitude of the output of the shift register to the corresponding gate line.

2. A display device according to claim 1, wherein the drive circuits each respectively comprise at least one thin film transistor and are integrally formed on the substrate, and
wherein the thin film transistors of the pixels and the thin film transistors of the drive circuits have a single channel.

3. A display device according to claim 1, wherein:
each of the booster circuit comprises a first thin film transistor, a second thin film transistor, and a capacitive element,
a gate electrode of the first thin film transistor is connected to a first switch signal,
a first electrode of the first thin film transistor is connected to an output of the shift register,
a second electrode of the first thin film transistor is connected to a gate electrode of the second thin film transistor and a first electrode of the capacitive element,
a first electrode of the second thin film transistor is connected to the common scan signal, and
a second electrode of the second thin film transistor is connected to a second electrode of the capacitive element and one of the gate lines.

4. A display device according to claim 2, wherein
the shift register comprises at least one thin film transistor and is integrally formed on the substrate,
the thin film transistors of the pixels, the thin film transistors of the drive circuits, and the thin film transistor of the shift register have a single channel.

5. A display device according to claim 1, wherein
each of the drive circuits comprises a reset circuit which applies an OFF potential of the thin film transistor of the pixel to the gate line during a period in which the output from the shift register is not inputted to the drive circuit.

6. A display device according to claim 5, wherein the reset circuit comprises an inverter circuit which inverts the output from the shift register.

7. A display device according to claims 1, wherein the drive circuit comprises a switch circuit which switches between stopping and permitting an operation of the booster circuit.

8. A display device according to claim 7, wherein the switch circuit is with inputted a first switch signal and a second switch signal, and the switch circuit stops the operation of the booster circuit during a period in which a potential of the first switch signal is lower than a potential of the second switch signal, and permits the operation of the booster circuit when a potential of the first switch signal is higher than a potential of the second switch signal.

9. A display device according to claim 7, wherein the control circuit is configured to perform at least one cycle operation of the shift register in a state that the operation of the booster circuit is stopped by controlling the switch circuit before starting a display and, thereafter, to permit the operation of the booster circuit to start the display.

10. A display device according to claim 1, wherein
the common scan signal comprises a first common scan signal which is transmitted through a first common scan signal line and a second common scan signal which is transmitted through a second common scan signal line and has a phase different from a phase of the first common scan signal, and
the booster circuits are divided into a first group in which the first common scan signal is inputted to the booster circuits in common and a second group in which the second common scan signal is inputted to the booster circuits in common.

11. A display device according to claim 10, wherein
the booster circuits which correspond to the odd-numbered gate lines belong to the first group, and
the booster circuits which correspond to the even-numbered gate lines belong to the second group.

12. A display device according to claim 1, wherein the display device comprises a counter substrate which is arranged to face the substrate in an opposed manner, and a liquid crystal layer which is sandwiched between the substrate and the counter substrate.

13. A display device comprising:
a substrate;
a plurality of gate lines formed on the substrate;
a plurality of drain lines formed on the substrate and crossing the plurality of gate lines;
a plurality of pixels having thin film transistors which are connected to the gate lines and the drain lines;
a video signal drive circuit to apply video signals to the drain lines; and
a control circuit to supply a plurality of signals to the video signal drive circuit, wherein:
the video signal drive circuit comprises a drain driver which outputs video signals in a time-division manner to a common video signal line, and distribution circuits which are integrally formed on the substrate to distribute the video signals outputted in said time-division manner from the common video signal line to at least two corresponding drain lines, and
each of the distribution circuits is controlled by a plurality of distribution control signals inputted to the distribution circuit, and a number of the plurality of distribution control signals for controlling distribution of the video signals from one common video signal line to the corresponding drain lines coupled to said one common video signal line is larger than a number of the drain lines corresponding to said one common video signal line.

14. A display device according to claim 13, wherein:
the distribution circuit comprises a plurality of thin film transistors, wherein a channel of the thin film transistors is equal to a channel of the thin film transistors of the pixels, the thin film transistors have respective first electrodes thereof connected to the common video signal line, have respective second electrodes thereof connected to the corresponding drain lines, and have voltages of respective gate electrodes controlled based on two respectively corresponding distribution control signals,
a voltage of the gate electrodes of the thin film transistors of the distribution circuit is changed to a first voltage in response to one of said two corresponding distribution control signals and is changed to a second voltage in response to the other of said two corresponding distribution control signals, and
the distribution control signals are used in common for distribution of at least two common video signal lines.

15. A display device according to claim 14, wherein
the channel of the thin film transistors and the channel of the thin film transistors of the pixels are n type, and
the second voltage is higher than the first voltage, and the second voltage is controlled to a voltage which is larger than a sum of a maximum value of a video signal voltage and a threshold value voltage of the thin film transistor and is set larger than the voltage of the distribution control signal.

16. A display device according to claim 14, wherein
the channel of the thin film transistors and the channel of the thin film transistors of the pixels are p type, and
the second voltage is lower than the first voltage, and the second voltage is controlled to a voltage which is smaller than a sum of a maximum value of a video signal voltage and a threshold value voltage of the thin film transistor and is set smaller than the voltage of the distribution control signal.

17. A display device according to claim 16, wherein a period in which the voltage of the gate electrodes of the thin film transistors of the distribution circuit assumes the second voltage is longer than 50% of a period in which the voltage of the gate electrodes assumes a value equal to or less than the first voltage.

18. A display device according to claim 16, wherein a period in which the voltage of the gate electrodes of the thin film transistors of the distribution circuit assumes the second voltage is equal to or more than 75% of a period in which the voltage of the gate electrodes assumes a value equal to or less than the first voltage.

19. A display device according to claim 16, wherein the distribution circuit comprises a circuit to distribute the video signals from one common video signal line to the drain lines which respectively correspond to the pixels of red, green and blue.

20. A display device according to claim 15, wherein a period in which the voltage of the gate electrodes of the thin film transistors of the distribution circuit assumes the second voltage is longer than 50% of a period in which the voltage of the gate electrodes assumes a value equal to or more than the first voltage.

21. A display device according to claim 15, wherein the distribution circuit comprises a circuit to distribute the video signals from one common video signal line to the drain lines which respectively correspond to the pixels of red, green and blue.

22. A display device according to claim 20, wherein a period in which the voltage of the gate electrodes of the thin film transistors of the distribution circuit assumes the second voltage is equal to or more than 75% of a period in which the voltage of the gate electrodes assumes a value equal to or more than the first voltage.

23. A display device according to claim 13, wherein the display device includes a counter substrate which is arranged to face the substrate in an opposed manner, and a liquid crystal layer which is sandwiched between the substrate and the counter substrate.

24. A display device comprising:
a substrate;
a plurality of gate lines formed on the substrate;
a plurality of drain lines formed on the substrate;
a plurality of pixels each comprising a thin film transistor which is connected to one of the gate lines and one of the drain lines;
a scan circuit formed on the substrate and connected to the plurality of gate lines; and
a control circuit connected to the scan circuit, wherein the scan circuit comprises a shift register and a plurality of selecting circuits each of which outputs a scan signal to one of the gate lines based on an output of the shift register,
wherein a common scan signal is inputted to the plurality of selecting circuits, said common scan signal comprising a voltage amplitude larger than a voltage amplitude of the output of the shift register, and
wherein each of the plurality of selecting circuits outputs the scan signal comprising the voltage amplitude larger than the voltage amplitude of the output of the shift register to the one of the gate lines during a time period when the output of the shift register is inputted to the selecting circuit.

25. A display device according to claim 24, wherein each of the plurality of selecting circuits respectively comprises at least one thin film transistors formed by polysilicon, and
the thin film transistors of the pixels and the thin film transistors of the plurality of selecting circuits have a single channel.

26. A display device according to claim 24, wherein each of the plurality of selecting circuits comprises a reset circuit which applies an OFF potential to the gate line during a period in which output from the shift register is not inputted to the selecting circuit.

27. A display device according to claims 24, wherein the plurality of selecting circuits comprise switch circuits which switch between stopping and permitting an operation of the plurality of selecting circuits.

28. A display device according to claim 27, wherein the switch circuits are inputted with a first switch signal and a second switch signal, and the switch circuits stops the operation of the plurality of selecting circuits when the first switch signal is a ground voltage and the second switch signal is a first voltage, and permits the operation of the plurality of selecting circuits when the first switch signal is a second voltage and the second switch signal is the ground voltage.

29. A display device according to claim 27, wherein the scan circuit performs at least one cycle operation of the shift register in a state that the operation of the selecting circuits is stopped by controlling the switch circuit before starting a display and, thereafter, the switch circuit permits the operation of the selecting circuits to start the display.

30. A display device according to claim 28, wherein the first voltage and the second voltage are positive voltages.

* * * * *